(12) United States Patent
Prabhu et al.

(10) Patent No.: US 9,666,513 B2
(45) Date of Patent: May 30, 2017

(54) WAFER-LEVEL FLIPPED DIE STACKS WITH LEADFRAMES OR METAL FOIL INTERCONNECTS

(71) Applicant: Invensas Corporation, San Jose, CA (US)

(72) Inventors: Ashok S. Prabhu, San Jose, CA (US); Rajesh Katkar, San Jose, CA (US); Sean Moran, Burlingame, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/342,744

(22) Filed: Nov. 3, 2016

(65) Prior Publication Data

US 2017/0077016 A1 Mar. 16, 2017

Related U.S. Application Data

(63) Continuation of application No. 14/883,864, filed on Oct. 15, 2015, now Pat. No. 9,490,195.
(Continued)

(51) Int. Cl.
*H01L 23/552* (2006.01)
*H01L 23/495* (2006.01)
(Continued)

(52) U.S. Cl.
CPC ........ *H01L 23/49575* (2013.01); *H01L 21/56* (2013.01); *H01L 23/295* (2013.01);
(Continued)

(58) Field of Classification Search
CPC ............. H01L 23/552; H01L 23/49838; H01L 23/49827; H01L 2224/04042; H01L 2224/06156
See application file for complete search history.

(56) References Cited

U.S. PATENT DOCUMENTS 3,639,888 A 2/1972 Pittman et al.
4,323,914 A 4/1982 Berndlmaier et al.
(Continued)

FOREIGN PATENT DOCUMENTS

CN 2512114 Y 9/2002
CN 1531069 A 9/2004
(Continued)

OTHER PUBLICATIONS

Cheah, Bok Eng, et al., Modeling and Electrical Characteristics Evaluation of Vertical Side-Chip Internconnection for Compact 3D Integration, School of Electrical and Electronic Engineering, Universiti Sains Malaysia, 13th Electronics Materials and Packaging (EMAP), Nov. 2011, 7 pages.
(Continued)

*Primary Examiner* — Phuc Dang
(74) *Attorney, Agent, or Firm* — Lerner, David, Littenberg, Krumholz & Mentlik, LLP

(57) ABSTRACT

An assembly includes a plurality of stacked encapsulated microelectronic packages, each package including a microelectronic element having a front surface with a plurality of chip contacts at the front surface and edge surfaces extending away from the front surface. An encapsulation region of each package contacts at least one edge surface and extends away therefrom to a remote surface of the package. The package contacts of each package are disposed at a single one of the remote surfaces, the package contacts facing and coupled with corresponding contacts at a surface of a substrate nonparallel with the front surfaces of the microelectronic elements therein.

20 Claims, 10 Drawing Sheets

Related U.S. Application Data

(60) Provisional application No. 62/222,737, filed on Sep. 23, 2015, provisional application No. 62/219,015, filed on Sep. 15, 2015, provisional application No. 62/194,051, filed on Jul. 17, 2015.

(51) Int. Cl.
  H01L 23/29  (2006.01)
  H01L 23/31  (2006.01)
  H01L 21/56  (2006.01)
  H01L 25/10  (2006.01)
  H01L 25/00  (2006.01)
  H01L 23/00  (2006.01)

(52) U.S. Cl.
  CPC .... *H01L 23/3107* (2013.01); *H01L 23/49541* (2013.01); *H01L 23/49568* (2013.01); *H01L 23/552* (2013.01); *H01L 24/32* (2013.01); *H01L 24/48* (2013.01); *H01L 24/73* (2013.01); *H01L 24/85* (2013.01); *H01L 24/96* (2013.01); *H01L 24/97* (2013.01); *H01L 25/105* (2013.01); *H01L 25/50* (2013.01); *H01L 2224/04042* (2013.01); *H01L 2225/1029* (2013.01); *H01L 2225/1094* (2013.01)

(56) References Cited

U.S. PATENT DOCUMENTS

| | | | |
|---|---|---|---|
| 4,336,551 | A | 6/1982 | Fujita et al. |
| 4,363,076 | A | 12/1982 | McIver |
| 4,500,905 | A | 2/1985 | Shibata |
| 4,706,166 | A | 11/1987 | Go |
| 4,726,777 | A | 2/1988 | Billman et al. |
| 4,784,972 | A | 11/1988 | Hatada |
| 4,951,122 | A | 8/1990 | Tsubosaki et al. |
| 4,967,262 | A | 10/1990 | Farnsworth |
| 5,047,837 | A | 9/1991 | Kitano et al. |
| 5,107,325 | A | 4/1992 | Nakayoshi |
| 5,138,438 | A | 8/1992 | Masayuki et al. |
| 5,200,362 | A | 4/1993 | Lin et al. |
| 5,218,234 | A | 6/1993 | Thompson et al. |
| 5,304,737 | A | 4/1994 | Kim |
| 5,311,401 | A | 5/1994 | Gates, Jr. et al. |
| 5,331,591 | A | 7/1994 | Clifton |
| 5,334,872 | A | 8/1994 | Ueda et al. |
| 5,347,428 | A | 9/1994 | Carson et al. |
| 5,365,106 | A | 11/1994 | Watanabe |
| 5,434,745 | A | 7/1995 | Shokrgozar et al. |
| 5,466,634 | A | 11/1995 | Beilstein, Jr. et al. |
| 5,534,729 | A | 7/1996 | Russell |
| 5,538,758 | A | 7/1996 | Beach et al. |
| 5,571,754 | A | 11/1996 | Bertin et al. |
| 5,592,019 | A | 1/1997 | Ueda et al. |
| 5,616,953 | A | 4/1997 | King et al. |
| 5,629,566 | A | 5/1997 | Doi et al. |
| 5,675,180 | A | 10/1997 | Pedersen et al. |
| 5,691,248 | A | 11/1997 | Cronin et al. |
| 5,698,895 | A | 12/1997 | Pedersen et al. |
| 5,716,759 | A | 2/1998 | Badehi |
| 5,721,151 | A | 2/1998 | Padmanabhan et al. |
| 5,731,631 | A | 3/1998 | Yama et al. |
| 5,737,191 | A | 4/1998 | Horiuchi et al. |
| 5,870,351 | A | 2/1999 | Ladabaum et al. |
| 5,879,965 | A | 3/1999 | Jiang et al. |
| 5,891,761 | A | 4/1999 | Vindasius et al. |
| 5,910,687 | A | 6/1999 | Chen et al. |
| 5,946,545 | A | 8/1999 | Bertin et al. |
| 5,965,947 | A | 10/1999 | Nam et al. |
| 6,030,854 | A | 2/2000 | Mashimoto et al. |
| 6,034,438 | A | 3/2000 | Petersen |
| 6,071,139 | A | 6/2000 | Corisis et al. |
| 6,087,716 | A | 7/2000 | Ikeda |
| 6,107,164 | A | 8/2000 | Ohuchi |
| 6,175,158 | B1 | 1/2001 | Degani et al. |
| 6,225,689 | B1 | 5/2001 | Moden et al. |
| 6,228,686 | B1 | 5/2001 | Smith et al. |
| 6,255,726 | B1 | 7/2001 | Vindasius et al. |
| 6,262,476 | B1 | 7/2001 | Vidal |
| 6,271,598 | B1 | 8/2001 | Vindasius et al. |
| 6,297,657 | B1 | 10/2001 | Thiessen et al. |
| 6,303,977 | B1 | 10/2001 | Schroen et al. |
| 6,315,856 | B1 | 11/2001 | Asagiri et al. |
| 6,326,244 | B1 | 12/2001 | Brooks et al. |
| 6,326,689 | B1 | 12/2001 | Thomas |
| 6,338,980 | B1 | 1/2002 | Satoh |
| 6,351,030 | B2 | 2/2002 | Havens et al. |
| 6,472,746 | B2 | 10/2002 | Taniguchi et al. |
| 6,476,467 | B2 | 11/2002 | Nakamura et al. |
| 6,566,760 | B1 | 5/2003 | Kawamura et al. |
| 6,569,709 | B2 | 5/2003 | Derderian |
| D475,981 | S | 6/2003 | Michii |
| 6,580,165 | B1 | 6/2003 | Singh |
| 6,582,992 | B2 | 6/2003 | Poo et al. |
| 6,593,648 | B2 | 7/2003 | Emoto |
| 6,607,938 | B2 | 8/2003 | Kwon et al. |
| 6,607,941 | B2 | 8/2003 | Prabhu et al. |
| 6,621,155 | B1 | 9/2003 | Perino et al. |
| 6,621,172 | B2 | 9/2003 | Nakayama et al. |
| 6,624,505 | B2 | 9/2003 | Badehi |
| 6,656,827 | B1 | 12/2003 | Tsao et al. |
| 6,667,543 | B1 | 12/2003 | Chow et al. |
| 6,670,701 | B2 | 12/2003 | Matsuura et al. |
| 6,674,159 | B1 | 1/2004 | Peterson et al. |
| 6,686,655 | B2 | 2/2004 | Moden et al. |
| 6,706,971 | B2 | 3/2004 | Albert et al. |
| 6,710,246 | B1 | 3/2004 | Mostafazadeh et al. |
| 6,717,061 | B2 | 4/2004 | Yamaguchi et al. |
| 6,722,213 | B2 | 4/2004 | Offen et al. |
| 6,730,997 | B2 | 5/2004 | Beyne et al. |
| 6,737,743 | B2 | 5/2004 | Urakawa |
| 6,747,348 | B2 | 6/2004 | Jeung et al. |
| 6,750,547 | B2 | 6/2004 | Jeung et al. |
| 6,756,252 | B2 | 6/2004 | Nakanishi |
| 6,777,767 | B2 | 8/2004 | Badehi |
| 6,802,446 | B2 | 10/2004 | Chaudhuri et al. |
| 6,844,623 | B1 | 1/2005 | Peterson et al. |
| 6,849,802 | B2 | 2/2005 | Song et al. |
| 6,853,557 | B1 | 2/2005 | Haba et al. |
| 6,908,784 | B1 | 6/2005 | Farnworth et al. |
| 6,910,268 | B2 | 6/2005 | Miller |
| 6,940,022 | B1 | 9/2005 | Vinciarelli et al. |
| 6,956,283 | B1 | 10/2005 | Peterson |
| 6,964,915 | B2 | 11/2005 | Farnworth et al. |
| 6,972,480 | B2 | 12/2005 | Zilber et al. |
| 6,973,718 | B2 | 12/2005 | Sheppard, Jr. et al. |
| 6,984,885 | B1 | 1/2006 | Harada et al. |
| 7,005,324 | B2 | 2/2006 | Imai |
| 7,029,949 | B2 | 4/2006 | Farnworth et al. |
| 7,061,125 | B2 | 6/2006 | Cho et al. |
| 7,115,986 | B2 | 10/2006 | Moon et al. |
| 7,125,750 | B2 | 10/2006 | Kwan et al. |
| 7,127,807 | B2 | 10/2006 | Yamaguchi et al. |
| 7,180,168 | B2 | 2/2007 | Imai |
| 7,190,060 | B1 | 3/2007 | Chiang |
| 7,196,262 | B2 | 3/2007 | Gronet |
| 7,208,335 | B2 | 4/2007 | Boon et al. |
| 7,208,345 | B2 | 4/2007 | Meyer et al. |
| 7,215,018 | B2 | 5/2007 | Vindasius et al. |
| 7,221,051 | B2 | 5/2007 | Ono et al. |
| 7,245,021 | B2 | 7/2007 | Vindasius et al. |
| 7,259,455 | B2 | 8/2007 | Seto |
| 7,279,363 | B2 | 10/2007 | Cherukuri et al. |
| 7,285,865 | B2 | 10/2007 | Kwon et al. |
| 7,335,533 | B2 | 2/2008 | Derderian |
| 7,344,917 | B2 | 3/2008 | Gautham |
| 7,355,274 | B2 | 4/2008 | Lim |
| 7,405,138 | B2 | 7/2008 | Ohuchi et al. |
| 7,408,243 | B2 | 8/2008 | Shiffer |
| 7,429,782 | B2 | 9/2008 | Brunnbauer et al. |
| 7,452,743 | B2 | 11/2008 | Oliver et al. |
| 7,514,350 | B2 | 4/2009 | Hashimoto |
| 7,521,288 | B2 | 4/2009 | Arai et al. |

(56) References Cited

U.S. PATENT DOCUMENTS

| | | |
|---|---|---|
| 7,535,109 B2 | 5/2009 | Robinson et al. |
| 7,564,142 B2 | 7/2009 | Hashimoto |
| 7,595,222 B2 | 9/2009 | Shimoishizaka et al. |
| 7,601,039 B2 | 10/2009 | Eldridge et al. |
| 7,638,869 B2 | 12/2009 | Irsigler et al. |
| 7,662,670 B2 | 2/2010 | Noma et al. |
| 7,662,671 B2 | 2/2010 | Saeki |
| 7,704,794 B2 | 4/2010 | Mess et al. |
| 7,732,912 B2 | 6/2010 | Damberg |
| 7,768,795 B2 | 8/2010 | Sakurai et al. |
| 7,829,438 B2 | 11/2010 | Haba et al. |
| 7,863,159 B2 | 1/2011 | Co et al. |
| 7,888,185 B2 | 2/2011 | Corisis et al. |
| 7,901,989 B2 | 3/2011 | Haba et al. |
| 7,919,846 B2 | 4/2011 | Hembree |
| 7,923,349 B2 | 4/2011 | McElrea et al. |
| 7,951,649 B2 | 5/2011 | Val |
| 7,952,195 B2 | 5/2011 | Haba |
| 8,022,527 B2 | 9/2011 | Haba et al. |
| 8,076,788 B2 | 12/2011 | Haba et al. |
| 8,178,978 B2 | 5/2012 | McElrea et al. |
| 8,373,280 B2 | 2/2013 | Harada et al. |
| 8,390,109 B2 | 3/2013 | Popovic et al. |
| 8,431,435 B2 | 4/2013 | Haba et al. |
| 8,551,815 B2 | 10/2013 | Avsian et al. |
| 8,618,659 B2 | 12/2013 | Sato et al. |
| 8,619,659 B2 | 12/2013 | Lee et al. |
| 8,629,543 B2 | 1/2014 | McElrea et al. |
| 8,633,576 B2 | 1/2014 | Zohni et al. |
| 8,674,482 B2 | 3/2014 | Shi et al. |
| 8,704,379 B2 | 4/2014 | Crane et al. |
| 8,723,332 B2 | 5/2014 | McElrea et al. |
| 9,123,418 B2 | 9/2015 | Lin et al. |
| 9,136,251 B2 | 9/2015 | Cheah et al. |
| 2001/0012725 A1 | 8/2001 | Maeda et al. |
| 2001/0031548 A1 | 10/2001 | Elenius et al. |
| 2002/0006686 A1 | 1/2002 | Cloud et al. |
| 2002/0027257 A1 | 3/2002 | Kinsman et al. |
| 2002/0045290 A1 | 4/2002 | Ball |
| 2002/0096349 A1 | 7/2002 | Hedler et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0185725 A1 | 12/2002 | Moden et al. |
| 2002/0187260 A1 | 12/2002 | Sheppard et al. |
| 2002/0190368 A1 | 12/2002 | Shimoe et al. |
| 2003/0038353 A1 | 2/2003 | Derderian |
| 2003/0038356 A1 | 2/2003 | Derderian |
| 2003/0038357 A1 | 2/2003 | Derderian |
| 2003/0060034 A1 | 3/2003 | Beyne et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |
| 2003/0092326 A1 | 5/2003 | Nishikawa et al. |
| 2003/0096454 A1 | 5/2003 | Poo et al. |
| 2003/0099085 A1 | 5/2003 | Duva |
| 2003/0122243 A1 | 7/2003 | Lee et al. |
| 2003/0143819 A1 | 7/2003 | Hedler et al. |
| 2003/0148597 A1 | 8/2003 | Tan et al. |
| 2003/0162369 A1 | 8/2003 | Kobayashi |
| 2003/0209772 A1 | 11/2003 | Prabhu |
| 2004/0113283 A1 | 6/2004 | Farnworth et al. |
| 2004/0142509 A1 | 7/2004 | Imai |
| 2004/0150095 A1 | 8/2004 | Fraley et al. |
| 2004/0173892 A1 | 9/2004 | Nakanishi |
| 2004/0195667 A1 | 10/2004 | Karnezos |
| 2004/0198033 A1 | 10/2004 | Lee et al. |
| 2004/0212083 A1 | 10/2004 | Yang |
| 2004/0217446 A1 | 11/2004 | Headley et al. |
| 2004/0227235 A1 | 11/2004 | Hashimoto |
| 2004/0238933 A1 | 12/2004 | Chen et al. |
| 2004/0251520 A1 | 12/2004 | Sasaki et al. |
| 2004/0262035 A1 | 12/2004 | Ko et al. |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0135067 A1 | 6/2005 | Park et al. |
| 2005/0148160 A1 | 7/2005 | Farnworth et al. |
| 2005/0156323 A1 | 7/2005 | Tokunaga |
| 2005/0230802 A1 | 10/2005 | Vindasius et al. |
| 2005/0248021 A1 | 11/2005 | Morkner |
| 2005/0258530 A1 | 11/2005 | Vindasius et al. |
| 2005/0287705 A1 | 12/2005 | Yang |
| 2005/0287709 A1 | 12/2005 | Lee et al. |
| 2006/0003552 A1 | 1/2006 | Okada |
| 2006/0035408 A1 | 2/2006 | Derderian |
| 2006/0046436 A1 | 3/2006 | Ohuchi et al. |
| 2006/0055050 A1 | 3/2006 | Numata et al. |
| 2006/0068567 A1 | 3/2006 | Beyne et al. |
| 2006/0076690 A1 | 4/2006 | Khandros et al. |
| 2006/0094165 A1 | 5/2006 | Hedler et al. |
| 2006/0097356 A1 | 5/2006 | Fujii et al. |
| 2006/0103000 A1 | 5/2006 | Kurosawa |
| 2006/0121645 A1 | 6/2006 | Ball |
| 2006/0138626 A1 | 6/2006 | Liew et al. |
| 2006/0220262 A1 | 10/2006 | Meyer et al. |
| 2006/0252180 A1 | 11/2006 | Moden et al. |
| 2006/0267173 A1 | 11/2006 | Takiar et al. |
| 2006/0273365 A1 | 12/2006 | Cross et al. |
| 2006/0278971 A1 | 12/2006 | Barnes et al. |
| 2007/0023900 A1 | 2/2007 | Toyoda |
| 2007/0029684 A1 | 2/2007 | Arai et al. |
| 2007/0065987 A1 | 3/2007 | Mess et al. |
| 2007/0102801 A1 | 5/2007 | Ishida et al. |
| 2007/0132082 A1 | 6/2007 | Tang et al. |
| 2007/0158799 A1 | 7/2007 | Chiu et al. |
| 2007/0158807 A1 | 7/2007 | Lu et al. |
| 2007/0170572 A1 | 7/2007 | Liu et al. |
| 2007/0181989 A1 | 8/2007 | Corisis et al. |
| 2007/0187811 A1 | 8/2007 | Arai et al. |
| 2007/0194462 A1 | 8/2007 | Kim et al. |
| 2007/0222054 A1 | 9/2007 | Hembree |
| 2007/0252262 A1 | 11/2007 | Robinson et al. |
| 2007/0284716 A1 | 12/2007 | Vindasius et al. |
| 2008/0029866 A1 | 2/2008 | Kim et al. |
| 2008/0083976 A1 | 4/2008 | Haba et al. |
| 2008/0083977 A1 | 4/2008 | Haba et al. |
| 2008/0112150 A1 | 5/2008 | Jones |
| 2008/0150158 A1 | 6/2008 | Chin |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1 | 10/2008 | Inomata |
| 2008/0251939 A1 | 10/2008 | Chung et al. |
| 2008/0284044 A1 | 11/2008 | Myers |
| 2008/0290493 A1 | 11/2008 | Tsunozaki |
| 2008/0303131 A1 | 12/2008 | McElrea et al. |
| 2008/0308921 A1 | 12/2008 | Kim |
| 2008/0315407 A1 | 12/2008 | Andrews, Jr. et al. |
| 2009/0020887 A1 | 1/2009 | Mizuno et al. |
| 2009/0020889 A1 | 1/2009 | Murayama et al. |
| 2009/0045524 A1 | 2/2009 | Mohammed et al. |
| 2009/0065948 A1 | 3/2009 | Wang |
| 2009/0068790 A1 | 3/2009 | Caskey et al. |
| 2009/0102038 A1 | 4/2009 | McElrea et al. |
| 2009/0146137 A1 | 6/2009 | Kim et al. |
| 2009/0160065 A1 | 6/2009 | Haba et al. |
| 2009/0209061 A1 | 8/2009 | Jeong |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0140811 A1 | 6/2010 | Leal et al. |
| 2010/0148352 A1 | 6/2010 | Moden |
| 2010/0207277 A1 | 8/2010 | Bauer et al. |
| 2010/0327461 A1 | 12/2010 | Co et al. |
| 2011/0006432 A1 | 1/2011 | Haba et al. |
| 2011/0031629 A1 | 2/2011 | Haba et al. |

(56) References Cited

U.S. PATENT DOCUMENTS

| | | | |
|---|---|---|---|
| 2011/0033979 A1 | 2/2011 | Haba et al. | |
| 2011/0049696 A1 | 3/2011 | Haba et al. | |
| 2011/0187007 A1 | 8/2011 | Haba et al. | |
| 2011/0248410 A1 | 10/2011 | Avsian et al. | |
| 2011/0266684 A1 | 11/2011 | Leal | |
| 2012/0061846 A1 | 3/2012 | Rathburn | |
| 2012/0080807 A1 | 4/2012 | Haba et al. | |
| 2012/0133057 A1 | 5/2012 | Haba et al. | |
| 2012/0211878 A1 | 8/2012 | Popovic et al. | |
| 2012/0313264 A1* | 12/2012 | Sato | H01L 23/13 257/783 |
| 2013/0083583 A1 | 4/2013 | Crisp et al. | |
| 2013/0099392 A1 | 4/2013 | McElrea et al. | |
| 2013/0099393 A1 | 4/2013 | Jeong et al. | |
| 2013/0119542 A1 | 5/2013 | Oh | |
| 2013/0154117 A1 | 6/2013 | Tan et al. | |
| 2013/0286707 A1 | 10/2013 | Crisp et al. | |
| 2014/0097526 A1* | 4/2014 | Suleiman | H01L 24/33 257/676 |
| 2014/0104786 A1 | 4/2014 | Clayton et al. | |
| 2014/0264945 A1 | 9/2014 | Yap et al. | |
| 2015/0200181 A1* | 7/2015 | Haga | B23K 20/005 438/127 |
| 2016/0035698 A1 | 2/2016 | Lee et al. | |
| 2016/0141232 A1* | 5/2016 | Cannon | H01L 23/552 257/659 |

FOREIGN PATENT DOCUMENTS

| | | |
|---|---|---|
| CN | 1638118 A | 7/2005 |
| CN | 1905148 A | 1/2007 |
| CN | 104332462 A | 2/2015 |
| DE | 102004039906 A1 | 8/2005 |
| EP | 1041624 A1 | 10/2000 |
| EP | 1763894 A2 | 3/2007 |
| EP | 2650880 A1 | 10/2013 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004047702 A | 2/2004 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 A | 12/2006 |
| JP | 2007073803 A | 3/2007 |
| JP | 2007523482 A | 8/2007 |
| JP | 2008160119 A | 7/2008 |
| JP | 2008205453 A | 9/2008 |
| JP | 2008236688 A | 10/2008 |
| JP | 2009-026969 | 2/2009 |
| JP | 2009027039 A | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| KR | 20080091980 | 10/2008 |
| TW | 475244 | 2/2002 |
| TW | 200425356 A | 11/2004 |
| TW | 200504995 A | 2/2005 |
| TW | 200527549 A | 8/2005 |
| TW | 200605298 A | 2/2006 |
| TW | 200721471 | 6/2007 |
| TW | 200913208 A | 3/2009 |
| TW | 200940570 A | 10/2009 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005081315 A2 | 9/2005 |
| WO | 2005101492 A2 | 10/2005 |
| WO | 2009032371 A1 | 3/2009 |
| WO | 2009052150 A1 | 4/2009 |
| WO | 2009114670 A2 | 9/2009 |
| WO | 2010057339 A1 | 5/2010 |

OTHER PUBLICATIONS

Kong, J., et al., Sensitivity Study of Channel Termination on Vertical Side-Chip Interconnection, Universiti Sains Malaysia, 35th International Electronic Manufacturing Technology Conference, 2012, 6 pages.

Han, Sang Wook, Wireless Interconnect using Inductive Coupling in 3D-ICs, University of Michigan, 2012, 133 pages.

U.S. Appl. No. 14/883,864 dated Oct. 15, 2015.

* cited by examiner

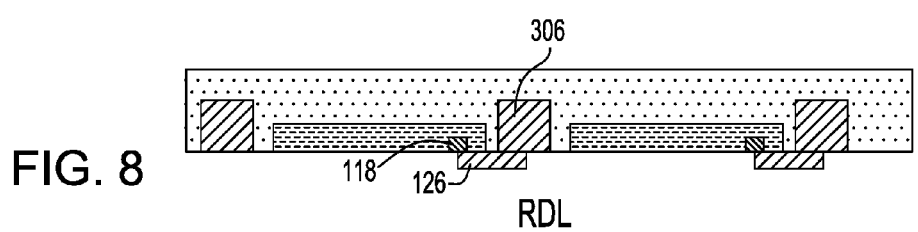
FIG. 8 RDL
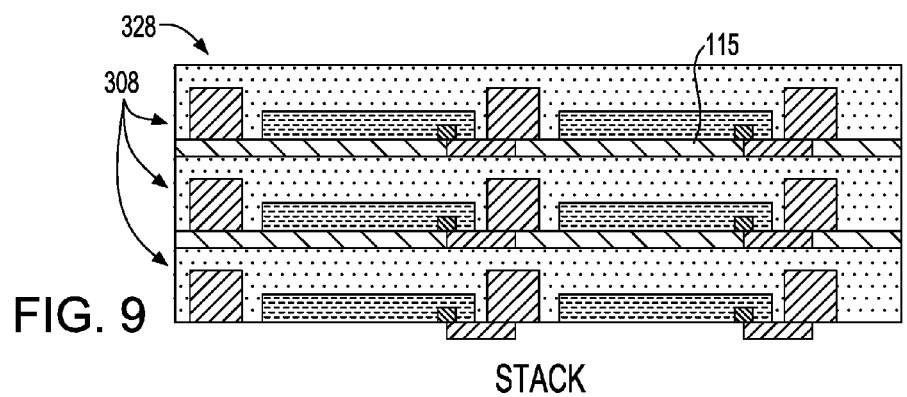
FIG. 9 STACK
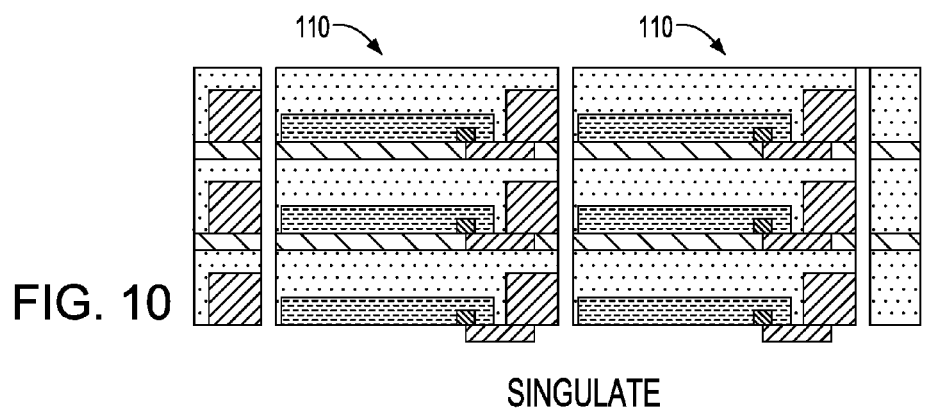
FIG. 10 SINGULATE

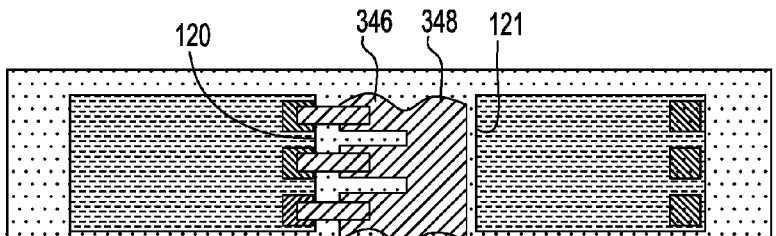
FIG. 17
FIG. 18
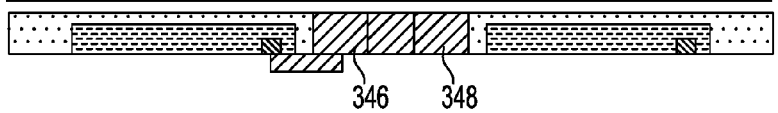
FIG. 19
FIG. 20
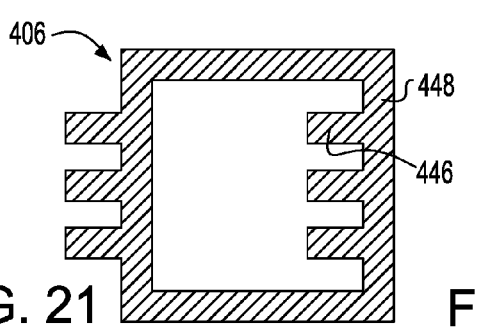
FIG. 21
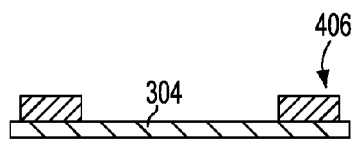
FIG. 22
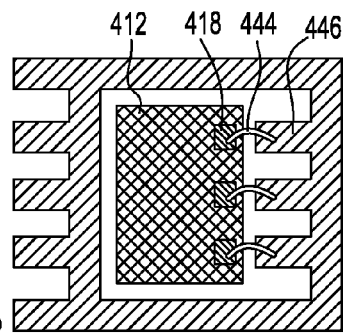
FIG. 23
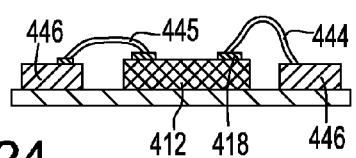
FIG. 24

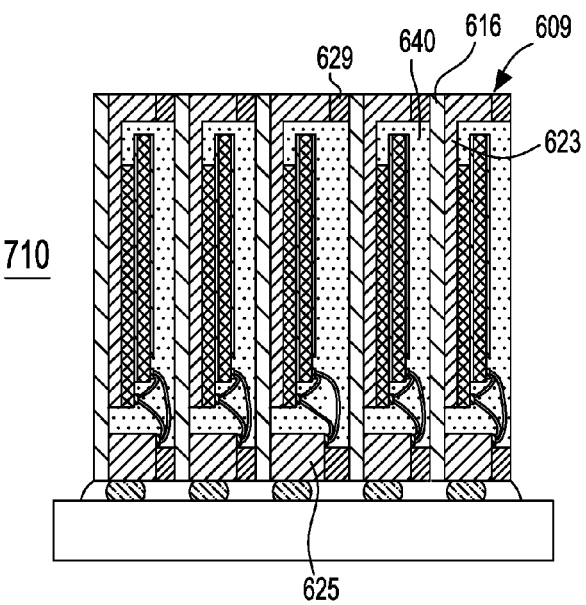
FIG. 38
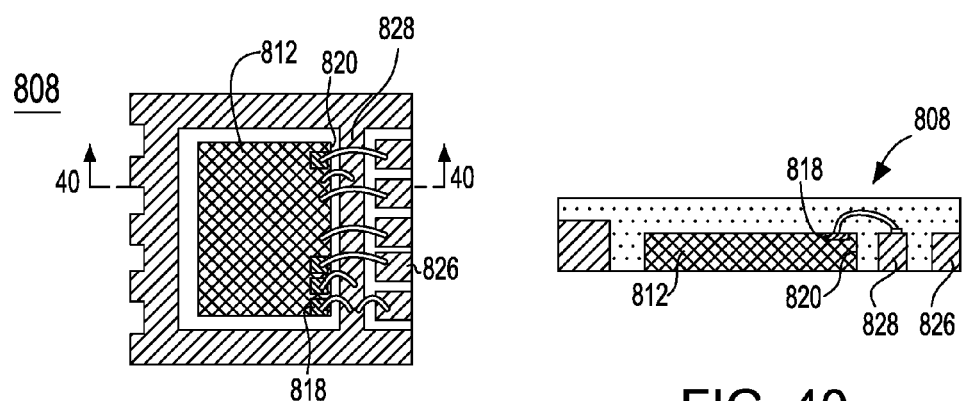
FIG. 39
FIG. 40
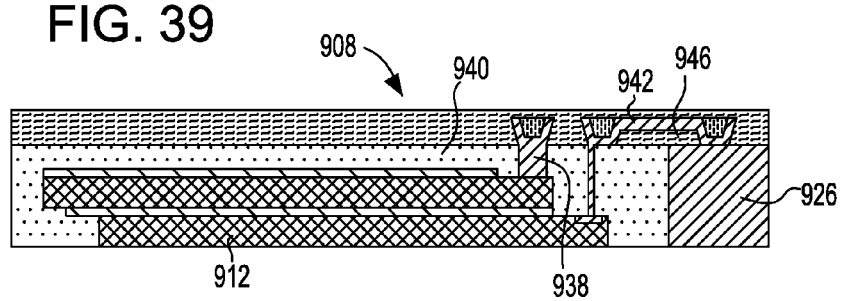
FIG. 41

WAFER-LEVEL FLIPPED DIE STACKS WITH LEADFRAMES OR METAL FOIL INTERCONNECTS

CROSS-REFERENCE TO RELATED APPLICATIONS

This application is a continuation of U.S. application Ser. No. 14/883,864 filed Oct. 15, 2015 U.S. Pat. No. 9,490,195, which claims the benefit of the filing dates of U.S. Provisional Patent Application Nos. 62/222,737 filed Sep. 23, 2015, 62/219,015 filed Sep. 15, 2015, and 62/194,051 filed Jul. 17, 2015, the disclosures of all of which are hereby incorporated herein by reference.

BACKGROUND OF THE INVENTION

Field of the Invention

The subject matter of this application relates to microelectronic packages and assemblies in which a plurality of semiconductor chips are stacked one above the other and electrically interconnected with a support element such as a package element or other circuit panel.

Description of the Related Art

Semiconductor die or chips are flat bodies with contacts disposed on the front surface that are connected to the internal electrical circuitry of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone.

Microelectronic packages can include wafer level packages, which provide a package for a semiconductor component that is fabricated while the chips are still in a wafer form. The wafer is subjected to a number of additional process steps to form the package structure and the wafer is then diced to free the individual die or chips. Wafer level processing may provide a cost savings advantage. Furthermore, fan-out wafer-level packages can be fabricated by encapsulating edges of an array of semiconductor chips within a reconstituted wafer, and then performing additional processing to form fan-out traces and contacts.

In order to save space certain conventional designs have stacked multiple microelectronic elements or semiconductor chips within a package. This allows the package to occupy a surface area on a substrate that is less than the total surface area of the chips in the stack. However, conventional stacked packages have disadvantages of complexity, cost, thickness and testability.

In spite of the above advances, there remains a need for improved stacked packages and especially stacked chip packages which incorporate multiple chips for certain types of memory, e.g., flash memory. There is a need for such packages which are reliable, thin, testable and that are economical to manufacture.

BRIEF SUMMARY OF THE INVENTION

In accordance with an aspect of the invention, a stacked microelectronic assembly can comprise a plurality of stacked encapsulated microelectronic packages. Each encapsulated microelectronic package may comprise a microelectronic element having a front surface which defines a plane, and a plurality of edge surfaces extending away from the plane of the front surface, the microelectronic element having a plurality of chip contacts at the front surface. Each package has a plurality of remote surfaces, and an encapsulation region contacting at least one edge surface of the microelectronic element and extending in the first direction away from the at least one edge surface to a corresponding one of the remote surfaces. Thus, the encapsulation region has a major surface substantially parallel to the plane of each stacked microelectronic element. A plurality of electrically conductive package contacts are disposed at a single one of the remote surfaces of each package, the chip contacts electrically coupled with the package contacts. The plurality of microelectronic packages can be stacked one above another in the stacked assembly such that the planes of the microelectronic elements are parallel to one another, and the major surfaces of the encapsulation regions of respective microelectronic packages in the stacked assembly are oriented towards one another.

In accordance with one or more particular aspects, the plurality of package contacts of each package in the stacked assembly face and are electrically coupled with a corresponding set of substrate contacts at a major surface of a substrate external to the encapsulation regions of each package of the stacked assembly, wherein the major surface of the substrate is non-parallel with the planes of the microelectronic elements in the stacked assembly.

In accordance with one or more particular aspects, the encapsulation region of each package may contact at least two of the edge surfaces of the microelectronic element of the package, such that at least two of the remote surfaces of the package are defined by surfaces of the encapsulation region which are spaced apart from the corresponding adjacent edge surfaces.

In accordance with one or more particular aspects, at least one of the microelectronic packages includes a plurality of the microelectronic elements stacked with the planes of each microelectronic element parallel to one another, wherein the encapsulation region contacts the edge surfaces of each of the stacked microelectronic elements, and the chip contacts of each of the stacked microelectronic elements are electrically coupled with the package contacts.

In accordance with one or more particular aspects, major surfaces the encapsulation regions of at least two adjacent microelectronic packages in the stacked assembly are separated from one another by a gap of at least 100 microns.

In accordance with one or more particular aspects, an adhesive contacts the remote surfaces of each package at which the package contacts are disposed, the major surface of the substrate and surrounds each of the connections between the package contacts and the substrate contacts, wherein features at at least a portion of the major surface of the substrate aligned with the gap define flow paths configured to convey the adhesive across the gap.

In accordance with one or more particular aspects, the assembly may further include a heat spreader having at least a portion disposed between the encapsulation regions of the at least two adjacent microelectronic packages in the stacked assembly.

In accordance with one or more particular aspects, ends of the package contacts coupled to the microelectronic element of each package extend beyond the remote surface of the encapsulation region of such package.

In accordance with one or more particular aspects, the package contacts comprise leadframe interconnects, the leadframe interconnects electrically coupled with the chip contacts through leads.

In accordance with one or more particular aspects, ends of the leadframe interconnects coupled to the microelectronic element in a respective one of the microelectronic packages are flush with or recessed relative to the remote surface of the encapsulation region.

In accordance with an aspect of the invention, a microelectronic package is provided which includes a plurality of stacked microelectronic elements each microelectronic element having a front surface defining a plane extending in a first direction and a second direction transverse to the first direction, a plurality of edge surfaces extending away from the plane of the front surface, each microelectronic element having a plurality of chip contacts at the front surface. The microelectronic elements are stacked with the planes parallel to one another. The package has a plurality of remote surfaces, and an encapsulation region contacting at least one edge surface of the stacked microelectronic elements and extending in the first direction away from the at least one edge surface to a corresponding one of the remote surfaces. Thus, the encapsulation region has a major surface substantially parallel to the plane of each stacked microelectronic element. A plurality of electrically conductive package contacts are disposed at a single one of the remote surfaces of each package, the chip contacts electrically coupled with the package contacts.

In accordance with one or more particular aspects, the encapsulation region may contact at least two of the edge surfaces of each microelectronic element of the package, such that at least two of the remote surfaces of the package are defined by surfaces of the encapsulation region which are spaced apart from the corresponding adjacent edge surfaces of the microelectronic elements.

In accordance with one or more particular aspects, ends of the package contacts coupled to the stacked microelectronic elements extend beyond the remote surface of the encapsulation region of such package.

In accordance with one or more particular aspects, the package contacts comprise leadframe interconnects, the leadframe interconnects electrically coupled with the chip contacts through leads coupled to the leadframe interconnects. In accordance with one or more particular aspects, the leads comprise at least one of wire bonds or traces.

In accordance with one or more particular aspects, ends of the leadframe interconnects are flush with or recessed relative to the remote surface of the encapsulation region.

In accordance with one or more particular aspects, the edge surfaces of the stacked microelectronic elements are staggered relative to one another.

In accordance with one or more particular aspects, at least one of the stacked microelectronic elements is bonded to a die attach pad underlying a surface of the at least one microelectronic element.

In accordance with an aspect of the invention, a microelectronic package includes a microelectronic element having a front surface defining a plane extending in a first direction and a second direction transverse to the first direction, a plurality of edge surfaces extending away from the plane of the front surface, the microelectronic element having a plurality of chip contacts at the front surface. The package has a plurality of remote surfaces, and an encapsulation region contacting at least one edge surface of the stacked microelectronic elements and extending in the first direction away from the at least one edge surface to a corresponding one of the remote surfaces. Thus, the encapsulation region has a major surface substantially parallel to the plane of each stacked microelectronic element. A plurality of electrically conductive package contacts are disposed at a single one of the remote surfaces of each package, the chip contacts electrically coupled with the package contacts. The package contacts may in some cases be leadframe interconnects.

In accordance with one or more particular aspects, the encapsulation region may contact at least two of the edge surfaces of each microelectronic element of the package, such that at least two of the remote surfaces of the package are defined by surfaces of the encapsulation region which are spaced apart from the corresponding adjacent edge surfaces of the microelectronic elements.

In accordance with one or more particular aspects, ends of the package contacts extend beyond the remote surface of the encapsulation region.

In accordance with one or more particular aspects, ends of the package contacts are flush with or recessed relative to the remote surface of the encapsulation region.

In accordance with one or more particular aspects, the leads comprise at least one of wire bonds or traces.

In accordance with one or more particular aspects, a substantially rigid leadframe element is disposed adjacent an edge surface of the microelectronic element, the leadframe element having a length dimension parallel to and at least as long as the adjacent edge surface. The leadframe element may have substantial cross-sectional area transverse to the length direction such that the leadframe element functions as at least one of a component of a heat spreader thermally coupled to the microelectronic element, or a component of an electromagnetic shield relative to the microelectronic element.

In accordance with one or more particular aspects, the leadframe element may extend parallel to each of at least three edge surfaces of the microelectronic element.

In accordance with another aspect of the invention, a microelectronic package comprises a microelectronic element having front and rear surfaces each defining a plane extending in a first direction and a second direction transverse to the first direction, a plurality of edge surfaces between the planes of the front and rear surfaces, the microelectronic element having a plurality of chip contacts at the front surface. A die attach pad of the leadframe underlies and is bonded to one of the front or rear surfaces of the microelectronic element. The package has a plurality of remote surfaces, and an encapsulation region contacting at least one edge surface of the stacked microelectronic elements and extending in the first direction away from the at least one edge surface to a corresponding one of the remote surfaces. Thus, the encapsulation region has a major surface substantially parallel to the plane of each stacked microelectronic element. A plurality of electrically conductive package contacts are disposed at a single one of the remote surfaces of each package, the chip contacts electrically coupled with the package contacts.

In accordance with one or more particular aspects, the encapsulation region may contact at least two of the edge surfaces of each microelectronic element of the package, such that at least two of the remote surfaces of the package are defined by surfaces of the encapsulation region which are spaced apart from the corresponding adjacent edge surfaces of the microelectronic elements.

In accordance with one or more particular aspects, a portion of the die attach pad which is not overlain by the microelectronic element bonded thereto is disposed at a second one of the remote surfaces other than the interconnect surface.

In accordance with one or more particular aspects, the portion of the leadframe can extend above a height of the die attach pad to at least a height of the package contacts.

In accordance with one or more particular aspects, the portion of the leadframe defines a discontinuous metal surface at at least one of the remote surfaces.

In accordance with one or more particular aspects, the portion of the leadframe extends above a height of the die attach pad to at least a height of the package contacts, the portion enclosing at least three adjoining edge surfaces of the microelectronic package.

In accordance with one or more particular aspects, the package contacts comprise features configured to avoid release of the package contacts at the interconnect surface of the encapsulation region.

BRIEF DESCRIPTION OF THE SEVERAL VIEWS OF THE DRAWINGS

FIGS. 3 through 10 are sectional views each depicting stages in a method of fabricating a microelectronic assembly in accordance with an embodiment of the invention.

FIG. 17 is a top-down plan view depicting a stage in a method of fabricating a microelectronic assembly in accordance with a variation of the embodiment of the invention depicted in FIGS. 3 through 10.

FIG. 18 is a sectional view corresponding to FIG. 17.

FIG. 19 is a top-down plan view depicting a stage in a method of fabricating a microelectronic assembly in accordance with a variation of the embodiment of the invention depicted in FIGS. 3 through 10.

FIG. 20 is a sectional view corresponding to FIG. 19.

FIG. 21 is a top-down plan view depicting a stage in a method of fabricating a microelectronic assembly in accordance with an embodiment of the invention.

FIG. 22 is a sectional view corresponding to FIG. 21.

FIG. 23 is a top-down plan view depicting a stage in a method of fabricating a microelectronic assembly in accordance with an embodiment of the invention.

FIG. 24 is a sectional view corresponding to FIG. 23.

FIG. 38 is a sectional view depicting a microelectronic assembly according to a variation of the embodiment of the invention depicted in FIG. 37A.

FIG. 39 is a top-down plan view depicting a microelectronic package in accordance with an embodiment of the invention.

FIG. 40 is a sectional view corresponding to FIG. 39.

FIG. 41 is a sectional view depicting a microelectronic package in accordance with a variation of an embodiment of the invention depicted in FIG. 32.

DETAILED DESCRIPTION OF THE INVENTION

As used in this disclosure with reference to a dielectric region or a dielectric structure of a component, e.g., circuit structure, interposer, microelectronic element, capacitor, voltage regulator, circuit panel, substrate, etc., a statement that an electrically conductive element is "at" a surface of the dielectric region or component indicates that, when the surface is not covered or assembled with any other element, the electrically conductive element is available for contact with a theoretical point moving in a direction perpendicular to that surface of the dielectric region from outside the dielectric region or component. Thus, a terminal or other conductive element which is at a surface of a dielectric region may project from such surface; may be flush with such surface; or may be recessed relative to such surface in a hole or depression in the dielectric region.

Figure 1:
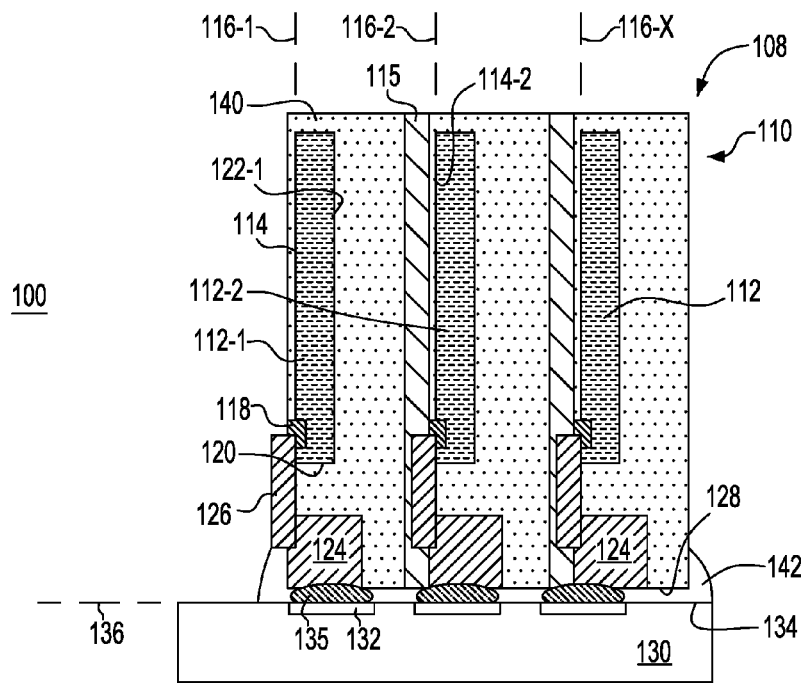
FIG. 1 is a sectional view depicting a microelectronic assembly in accordance with an embodiment of the invention.

FIG. 1 illustrates a microelectronic assembly 100 in accordance with an embodiment of the invention. As seen in FIG. 1, microelectronic assembly 100 includes a package stack 110 which includes a plurality of stacked microelectronic subassemblies or microelectronic packages 108, each microelectronic subassembly including one or more microelectronic elements 112 such as a semiconductor chip. Microelectronic assembly 100 and other microelectronic assemblies disclosed or referenced herein can provide enhanced storage density which can be especially advantageously provided in systems used in data centers, among which include enterprise systems, government systems, hosted systems, search engine systems, cloud storage, or other large-scale data centers.

In one example, microelectronic element 112 may be a stack of one or more semiconductor chips. In one example, each of the semiconductor chips may include one or more memory storage arrays, which may include a particular memory type such as nonvolatile memory. Nonvolatile memory can be implemented in a variety of technologies some of which include memory cells that incorporate floating gates, such as, for example, flash memory, and others which include memory cells which operate based on magnetic polarities. Flash memory chips are currently in widespread use as solid state storage as an alternative to magnetic fixed disk drives for computing and mobile devices. Flash memory chips are also commonly used in portable and readily interchangeable memory drives and cards, such as Universal Serial Bus (USB) memory drives, and memory cards such as Secure Digital or SD cards, microSD cards (trademarks or registered trademarks of SD-3C), compact flash or CF card and the like. Flash memory chips typically have NAND or NOR type devices therein; NAND type devices are common Other examples of semiconductor chips 112 may also include one or more DRAM, NOR, microprocessor, controller die, etc. or combinations thereof. Each semiconductor chip may be implemented in one of various semiconductor materials such as silicon, germanium, gallium arsenide or one or more other Group III-V semiconductor compounds or Group II-VI semiconductor compounds, etc. The microelectronic elements 112 in one or more microelectronic subassemblies 108 and in one or more "package stacks" 110 may be a combination of different chip functionalities as described above and a combination of various semiconductor materials as described above. In one embodiment, a microelectronic element may have a greater number of active devices for providing memory storage array function than for any other function.

Each microelectronic element, e.g., semiconductor chip 112 has a front surface 114 defining a respective plane 116-$x$ of a plurality of planes 116-1, 116-2, etc. Each semiconductor chip 112 has a plurality of contacts 118 at its front surface and an edge surface 120 which extends away from the front surface of such chip. Each chip also has a rear surface 122 opposite from its front surface 114.

Although the front surfaces of each of the chips in the package stack are shown all oriented in the same direction in FIG. 1, the front surfaces of one or more of the chips in the package stack can be oriented in the opposite direction such that the front surfaces of at least two of the chips which are adjacent one another would either face each other or would face in opposite directions away from one another.

In the example seen in FIG. 1, each package stack 110 may include a dielectric region 115 that extends between the rear surface 122-1 of a first chip 112-1 and a rear surface or front surface 114-2 of a second chip 112-2 that is adjacent to the first chip in the package stack. Such dielectric regions are disposed between adjacent surfaces of other chips in the package stack depicted in FIG. 1. The dielectric region may include one or more adhesive layers or other dielectric material. Typically, the dielectric region includes at least adhesive layers coupled to each of the opposed front or rear surfaces of adjacent chips in the package stack. In one embodiment, the dielectric region 115 includes one or more layers of epoxy, elastomer, polyimide or other polymeric material.

Figure 4:
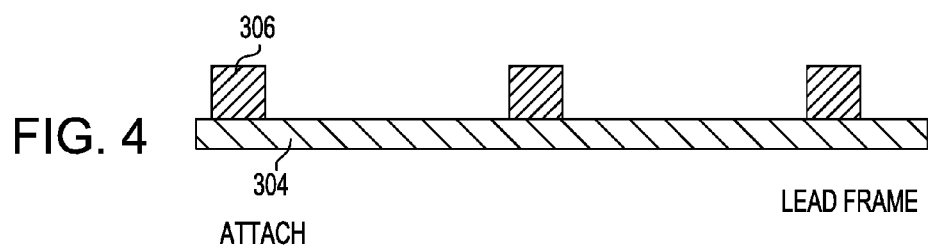

The package stack also includes a plurality of package contacts which may be defined by metal leadframe interconnects 124 electrically coupled to a chip contact 118 on a microelectronic element through a lead. As seen in FIG. 1, each package contact can be electrically coupled with the chip contact 118 at a front surface of a microelectronic element through a trace 126, the trace extending in a direction generally parallel to the front surface 114 towards an edge surface 120 of the respective chip. The traces can be formed by depositing an electrically conductive material. For example, the traces can be formed by plating a metal onto and in-between the contacts 118 and the leadframe 306 (See FIG. 4 and process description below), wherein the leadframe can serve as an electrical commoning element in a process that includes electrolytic plating. In some embodiments, a seed layer therefor can be formed by electroless plating or sputtering. Alternatively, the traces 126 can be formed by depositing drops, droplets or lines of electrically conductive polymer material or electrically conductive ink, or alternatively by blanket depositing such material and then removing the material between laterally adjacent contacts on the same microelectronic subassembly or package 108, and between adjacent portions of the leadframe on the same microelectronic package 108.

As depicted in FIG. 1, each of the leadframe interconnects 124, each of which is coupled to a chip contact of at least one microelectronic element of a respective package 108, may extend to a peripheral edge 128 or "remote surface" of the respective package 108. A dielectric region or encapsulant region contacts the chip contacts at the front surface of the package, such that the remote surface 128 is spaced apart from the edge surface of the microelectronic element adjacent to the remote surface. In particular cases, the encapsulant region can extend from two or more edge surfaces of the microelectronic element to corresponding remote surfaces of the package spaced apart from the edge surfaces.

All leadframe interconnects of a package are disposed at the same remote surface of the encapsulation such that the leadframe interconnects face a major surface 134 of a substrate 130 or support element and joined to corresponding substrate contacts at the major surface 134. The substrate 130 may be a dielectric element or other substrate and which may have one or multiple layers of dielectric material and one or multiple electrically conductive layers thereon. The substrate 130 can be formed of various materials, which may or may not include a polymeric component, and may or may not include an inorganic component. Alternatively, the substrate may be wholly or essentially polymeric or may be wholly or essentially inorganic. In various non-limiting examples, the support element can be formed of a composite material such as glass-reinforced epoxy, e.g., FR-4, a semiconductor material, e.g., Si or GaAs, or glass or ceramic material.

The substrate can be one that has contacts on a lower surface facing away from the microelectronic assemblies, the contacts configured for surface mounting to another component which can be a card, tray, motherboard, etc., such as via a land grid array (LGA), ball grid array (BGA), or other technique. In another example, the substrate can be a card component having slide contacts on top and bottom surfaces thereof, such as for insertion into a socket. In yet another example, another component such as universal serial bus (USB) controller or other communications controller can be mounted to the substrate and electrically coupled with the microelectronic assembly, such component assisting in or controlling a flow of information between the microelectronic assembly and a system.

As seen in FIG. 1, electrically conductive material 135 such as conductive masses, conductive pillars, stud bumps or other suitable electrically conductive material may be used to electrically connect each of the leadframe interconnects 124 at an end thereof to a corresponding substrate contact 132. Here, the conductive material 135 can be in form of electrically conductive bumps such as masses of solder, tin, indium or eutectic material, or drops or droplets of electrically conductive polymer material or electrically conductive ink on surfaces of the substrate contacts and contacting the leadframe interconnects 124.

The electrically conductive material may be applied thereto through a transfer mold of solder bumps, balls or features, or application of solder balls, for example, or may alternatively be deposited on the substrate contacts by plating or depositing a metal or other conductive material. Alternatively, the electrically conductive material 135 can be applied by depositing an electrically conductive ink or paste or an electrically conductive polymer material onto an exposed surface of the substrate contact 132.

Support element 130 may be organic substrate or semiconducting materials like Si, GaAs, etc. As seen in FIG. 1, the parallel planes 116-x defined by the front surfaces of the chips 114 are oriented transverse to, i.e., in a direction non-parallel to, a plane 136 defined by the major surface 134 of the support element.

In the example shown in FIG. 1, a dielectric region 140 which in some cases may be made of or include an encapsulant material, overlies the edge surface 120 of a respective chip. Each chip may have such dielectric region overlying the edge surface thereof. In an example, the dielectric region 140 may be or may include a molded dielectric region. In one example, the dielectric region may comprise a polymeric dielectric material, or alternatively a polymeric dielectric material with a filler therein which may have a lower coefficient of thermal expansion than the polymeric material. In some examples, the filler may include particles, flakes or a mesh or scaffold of an inorganic material such as a glass, quartz, ceramic or semiconductor material, among others.

As illustrated in FIG. 1, the parallel planes 116-x may be oriented in a direction orthogonal to the plane 136 of the support element major surface. FIG. 1 shows an example in which the major surface 134 of the support element faces the edge surfaces 120 of each chip. An adhesive 142, which may be an underfill, may be applied surrounding the electrical connections between the leadframe interconnects and the substrate contacts and the adhesive may have a function to mechanically reinforce or stiffen such electrical connections and may help the electrical connections withstand stresses due to differential thermal expansion between the chips 112 and the support element 130.

Figure 2:
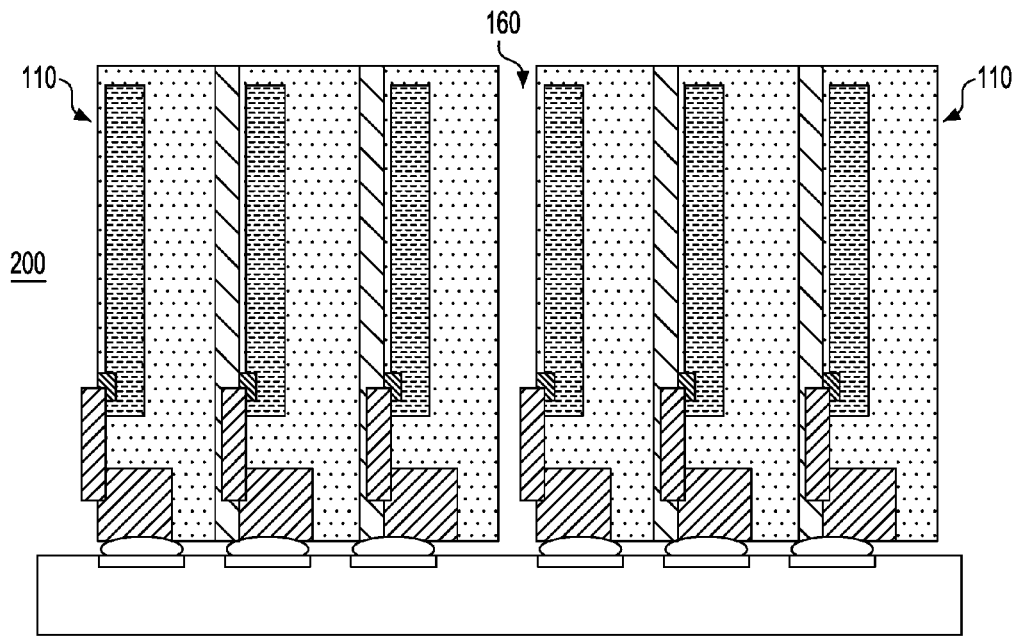
FIG. 2 is a sectional view depicting a microelectronic assembly in accordance with an embodiment of the invention.

Referring to FIG. 2, in a microelectronic assembly 200 according to variation of the embodiment seen in FIG. 1, a plurality of the microelectronic stacks 110 can be mounted and electrically connected to the substrate contacts 132. The distance in an orthogonal direction between respective package stacks 110 defines a gap 160 which, in some cases may be 100 microns, or may range from 100 to 200 microns in dimension, or may have a greater value.

Within gap 160 an adhesive can be provided, and/or other elements, which may in some cases include a heat spreader as further describe below, or passive components, hardware, or other components which may or may not be electrically interconnected with one or more of the package stacks 110.

Figure 3:
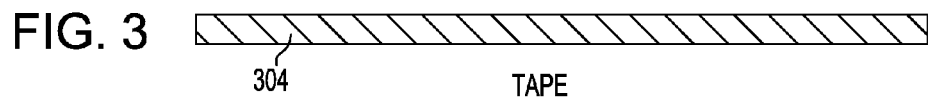

In the above embodiments shown in FIG. 1 and FIG. 2, the leadframe interconnects 124 may extend to and be flush with a peripheral edge surface 128 of the dielectric region 140 of the microelectronic package. Alternatively, in other embodiments which are not specifically shown in FIG. 1 or FIG. 2, the leadframe interconnects may be recessed relative to the peripheral edge surface 128, or may extend beyond the peripheral edge surface 128. In a particular variation of such embodiment in which the package contacts such as leadframe interconnects 124 project beyond the peripheral edge surface 128, provision can be made for the projecting leadframe interconnects 124 to be inserted into one or more corresponding features of the support element 130, or embedded in the support element. Referring to FIG. 3 et seq., stages in a method of fabricating a microelectronic assembly will now be described. As seen therein, a leadframe 306 is attached to an adhesive tape 304 such as may be used for dicing or other temporary placement of components during manufacturing and assembly. The tape and leadframe may extend beyond that shown in FIGS. 3-4 to encompass a larger area, such as that of a panel, e.g., which typically has dimensions of 500 millimeters by 500 millimeters.

Figure 5:
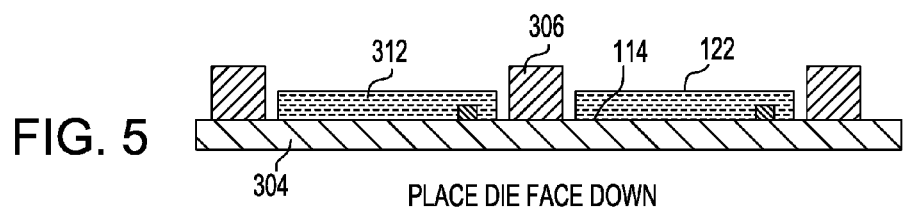
Figure 6:
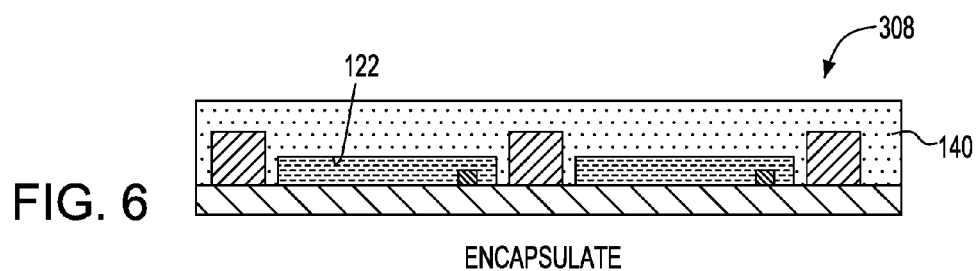

Next, as shown in FIG. 5, a plurality of microelectronic elements 312 are attached or otherwise placed face-down towards the tape 304 at locations between portions of the leadframe 306. The front surfaces 114 of the microelectronic elements face toward the tape 304 and the rear surfaces 122 face away therefrom. Thereafter, a dielectric material 140 is applied into spaces between the microelectronic elements 312 and the leadframe to form a reconstituted panel 308. Typically, the dielectric material covers the rear surfaces 122 and the lead frame as seen in FIG. 6, but this need not be so in other embodiments. The dielectric material typically is an encapsulant as described above, and in some examples can be applied by a molding process to form a molded dielectric encapsulation.

Figure 7:
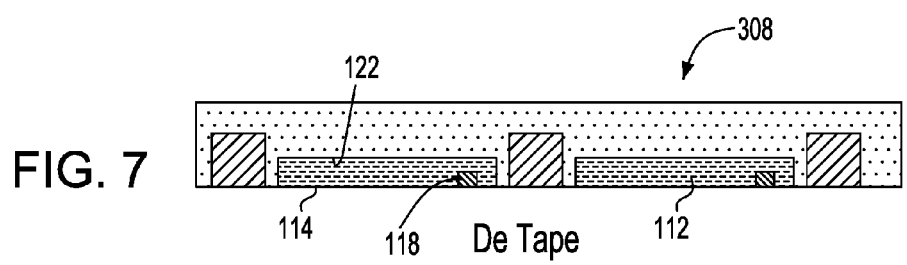

As further seen in FIG. 7, the tape 304 is removed, leaving the reconstituted panel 308 shown therein with the front faces 114 and contacts 118 of the microelectronic elements 112 exposed. Thereafter, as seen in FIG. 8, the above-described electrically conductive traces 126 are formed which electrically connect the contacts 118 with portions of the leadframe 306 adjacent thereto.

Referring to FIG. 9, a plurality of the reconstituted panels 308 are stacked one atop the other with an adhesive or other dielectric layer 115 between adjacent panels to form a stacked panel assembly 328. In a particular embodiment, the dielectric layer 115 can be omitted when other structure such as a fixture or frame mechanism maintains the positions of the reconstituted panels relative to one another. Thereafter, as seen in FIG. 10, the stacked panel assembly is singulated into individual "package stacks" 110, each package stack 110 being as described above relative to FIG. 1. The package stacks 110 then are assembled with respective support elements 130 to form the assemblies 100, 200 seen in FIG. 1 or FIG. 2.

In another sequence, the reconstituted panel 308 with electrical conductive traces 126 on them (FIG. 8) can be singulated first to form individual microelectronic packages. These individual packages are then stacked one atop the other with an adhesive or other dielectric layer 115 between adjacent packages to form a microelectronic stack 110. The microelectronic stacks 110 then are assembled with respective support elements 130 to form the assemblies 100, 200 seen in FIG. 1 or FIG. 2.

Figure 11:
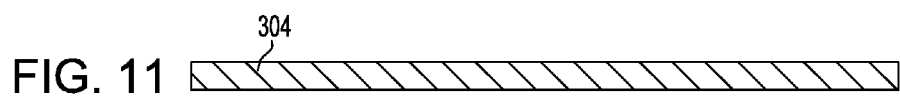
FIGS. 11 through 13 are each sectional views depicting stages in a method of fabricating a microelectronic assembly in accordance with a variation of the embodiment of the invention depicted in FIGS. 3 through 10.
Figure 12:
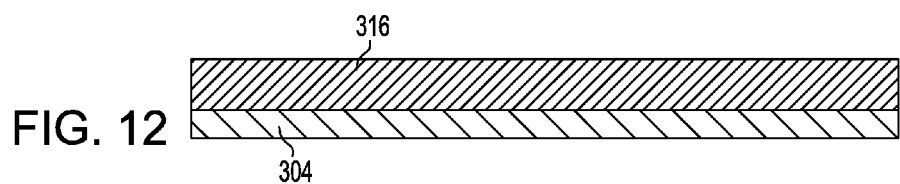
Figure 13:
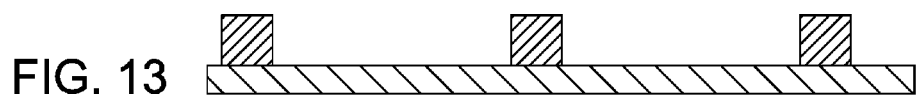

Referring now to FIGS. 11-13, in a variation of the above-described method, instead of attaching a leadframe to an adhesive tape, a metal sheet 316, e.g., a foil of copper or a foil having a layered metal structure which includes a foil of copper can be attached to an adhesive tape. Leadframes typically have a thickness of 100 micrometers (hereinafter "microns") in a direction orthogonal to the faces of the microelectronic element. The metal sheet 316, in some cases, can be made thinner than the leadframe, for example, ranging from 1 to 99 microns in thickness. Alternatively, the metal sheet 316 can be made thicker than a typical leadframe. Also, the metal sheet in some cases can be pre-patterned prior to being attached to the tape 304. FIG. 13 illustrates the metal sheet after patterning performed subsequent to attaching the metal sheet to the tape 304. Thereafter, the same processing as described above is performed to fabricate a microelectronic assembly 100 or 200 as seen in FIG. 1 or FIG. 2. In such case, the words "leadframe interconnect" as used herein refer to portions of such metal sheet 316 which remain in the final microelectronic assembly 100 fabricated in this manner.

Figure 14:
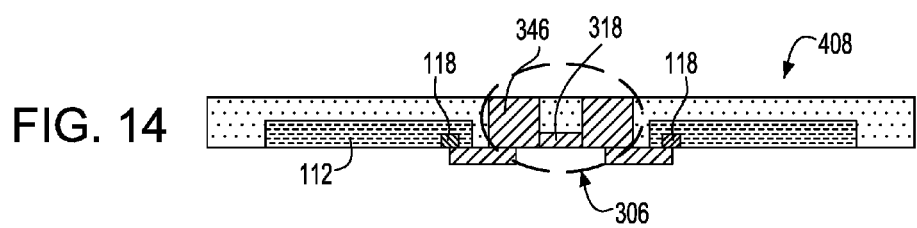
FIG. 14 is a sectional view depicting a stage in a method of fabricating microelectronic assembly in accordance with a variation of the embodiment of the invention depicted in FIGS. 3 through 10.
Figure 15:
FIG. 15 is a partial fragmentary top-down plan view corresponding to FIG. 14.

FIG. 14 illustrates a microelectronic subassembly 408 formed in a variation of the above-described process. In this case, the contacts 118 on adjacent microelectronic elements 112 are disposed near edges of the microelectronic elements such that contacts 118 on an adjacent pair of microelectronic elements are proximate to one another. Thus, the traces 126 extend from the contacts on each of the adjacent microelectronic elements to the leadframe or metal sheet disposed between the adjacent microelectronic elements. As also seen in FIG. 14 and in the partial fragmentary view of FIG. 15, the leadframe 306 or metal sheet can be patterned prior to forming the encapsulation such that portions 318 of the leadframe 306 or metal sheet disposed between fingers 346 of the leadframe 306 have smaller thickness than the fingers 346. As used herein, "fingers" refer to laterally extending portions of the leadframe 306 or of a metal sheet 316 prior to singulation into the package stacks 110 seen in FIG. 10. Providing the smaller thickness may improve subsequent processing such as the cutting process described above relative to FIG. 10 where the cutting instrument can cut through the portions 318 having the smaller thicknesses.

Figure 16:
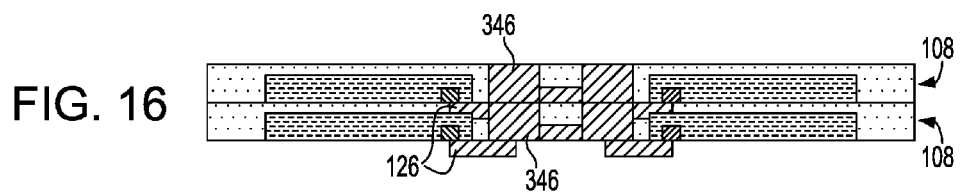
FIG. 16 is a sectional view depicting a stage in a method of fabricating a microelectronic assembly in accordance with a variation of the embodiment of the invention depicted in FIGS. 3 through 10.

FIG. 16 illustrates a further variation in which individual microelectronic subassemblies 108 are directly electrically coupled with one another through the leadframe fingers 346 or metal sheet portions, the traces 126, or both.

FIGS. 17-18 illustrate a further variation in which the leadframe fingers extend laterally from a support element 348 of the leadframe which has substantial width in a direction extending between the adjacent edges 120, 121 of the microelectronic elements shown in FIGS. 17-18. Referring to FIGS. 19-20, after the singulation described above referring to FIG. 10, a portion of the support element 348, severed from the leadframe fingers 346, now remains as part of the microelectronic package stack 110-2. In one example, the severed support element 348 may function as an electrical commoning layer for providing a ground or power connection. In a particular example, the severed support element 348 may serve as an embedded heat spreader integrated as a part of microelectronic subassembly 108. When direct electrical or thermal connections are provided between the severed support elements 348 at each level in the microelectronic package stack 110-2, an effective heat spreader can be provided for transporting and thermal energy from areas near a support element 130 as seen in FIG. 1 to a top of the assembly remote from the support element.

In another embodiment as seen in FIGS. 21 and 23, fingers 446 of the leadframe 406 extend from a leadframe support element 448 which encompasses an area of the microelectronic element. FIG. 22 depicts the leadframe 406 or metal sheet disposed on a tape 304 as described above. Referring to FIGS. 23-24, a microelectronic element 412 is placed face-up on the tape 304 and wire bonds 444 are formed which electrically connect contacts 418 of the microelectronic element with the fingers 446.

FIG. 24 illustrates two examples of wire bonds. In a first example, the ball-bond for the wire bond 444 is formed on the contact 418 of the microelectronic element and a stitch bond is formed on the finger 446. In a second example, the ball-bond of the wire bond 445 is formed on the finger 446 and the stitch bond is formed on the contact of the microelectronic element. An assembly having a lower height can be obtained by using a reverse-bonding technique in which the ball-bond is formed on the element which has a substantially lower height than the other element to which it is connected through the wire bond. Depending on whether the microelectronic element or the leadframe has the greater height, reverse-bonding technique can help decrease the loop height of the wire bond, effectively reducing a height of the wire-bonded assembly seen in FIGS. 23-24.

Figure 25:
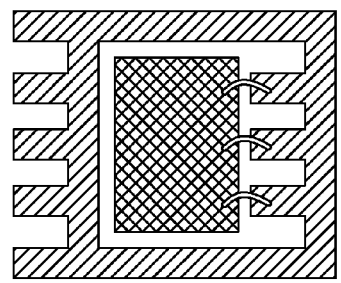
FIG. 25 is a top-down plan view depicting a stage in a method of fabricating a microelectronic assembly in accordance with an embodiment of the invention.
Figure 26:
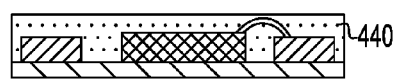
FIG. 26 is a sectional view corresponding to FIG. 25.

FIGS. 25-26 illustrate the subassembly after forming a dielectric region 440 thereon, which typically is a dielectric encapsulant such as described above, and which is typically formed by a molding process.

Figure 27:
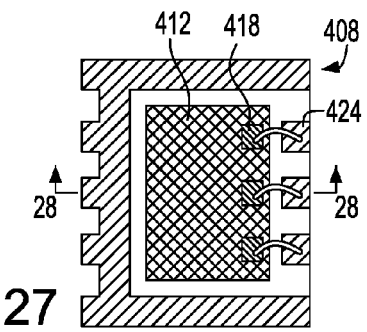
FIG. 27 is a top-down plan view depicting a stage in a method of fabricating a microelectronic assembly in accordance with an embodiment of the invention.
Figure 28:
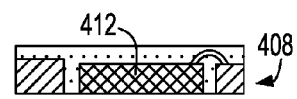
FIG. 28 is a sectional view corresponding to FIG. 27.

FIGS. 27-28 illustrate subsequent singulation of the subassembly into individual microelectronic packages 408, each package 408 including a microelectronic element 412 having contacts 418 electrically connected to individual leadframe interconnects 424 formed by separating the leadframe fingers 446 from other portions of the leadframe.

Figure 29:
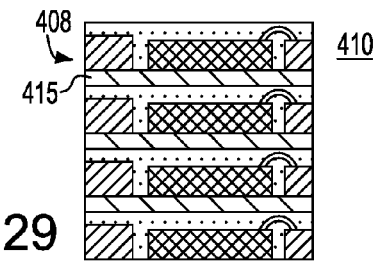
FIG. 29 is a sectional view depicting a stage in a method of fabricating microelectronic assembly in accordance with an embodiment of the invention.

FIG. 29 illustrates a stage in which the individual microelectronic packages 408 have been stacked and assembled together one atop the other to form the microelectronic stack 410. As seen in FIG. 29, a dielectric material or adhesive 415 can mechanically bind adjacent microelectronic packages 408 to one another. Alternatively, any of the techniques described above relative to FIG. 1 or FIG. 16, for example, can be used to maintain the positions of the microelectronic packages relative to one another.

Figure 30:
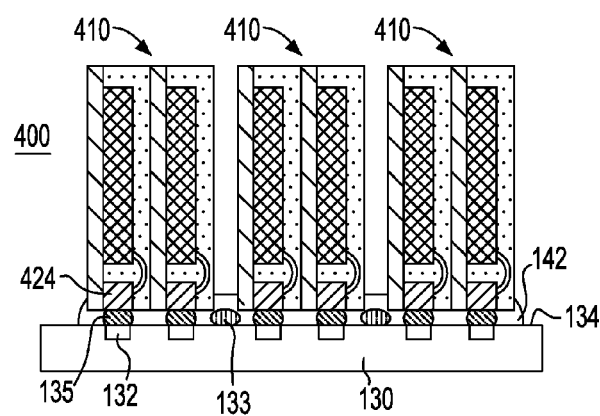
FIG. 30 is a sectional view depicting a stage in a method of fabricating microelectronic assembly in accordance with an embodiment of the invention.

FIG. 30 illustrates an assembly which includes one or more microelectronic package stacks 410 for which the leadframe interconnects 424 of each package stack 410 are electrically coupled with corresponding contacts 132 at a major surface 134 of a support element 130, e.g., through electrically conductive material 135 as described above. In this case, each package stack 410 is shown including only two microelectronic packages 408, although each package stack 410 can include a greater number of microelectronic packages 408. In a variation of the embodiment shown in FIG. 30 (not shown), each microelectronic package 408 can be assembled individually with the support element. FIG. 30 further illustrates a dielectric stiffening material 142, e.g., an underfill, contacting the remote surfaces of each package at which the package contacts are disposed, and the major surface of the substrate, the stiffening material surrounding each of the connections between the package contacts and the substrate contacts. As further shown, features 133 such as dummy bumps, which can have either electrically conductive or insulating properties, can be disposed at at least a portion of the major surface of the substrate aligned with a gap between package stacks, such features defining flow paths configured to convey the dielectric stiffening material across the gap.

Figure 30A:
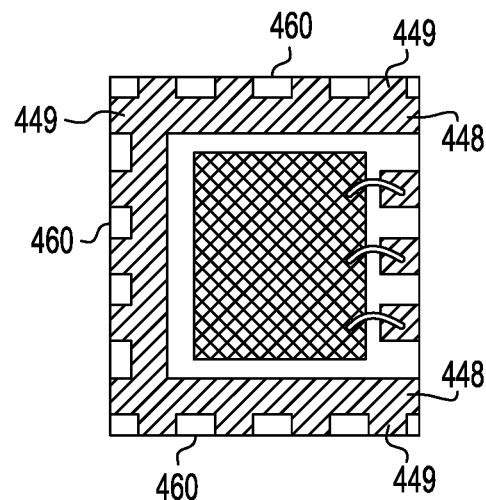
FIG. 30A is a top-down plan view illustrating a stage in a variation of the method illustrated in accordance with FIGS. 21-30.

Referring to FIG. 30A, in a variation of the embodiment described above relative to FIGS. 21-30, leadframe elements including leadframe support elements 448 define a discontinuous metal surface at at least one of the remote surfaces 460 of the encapsulation region. In such variation, the extent of cutting required of the leadframe support elements 448 is reduced. In this case, the cutting instrument can be positioned so as to cut through leadframe fingers 449 at peripheral edges of each microelectronic package rather than through leadframe support elements 448 which extend continuously in the same direction as the path of the cutting instrument. With the reduced cutting provided in this way, a blade or other element of the cutting instrument may be subject to less wear, and other benefits such as improved process window, or less production of debris may be achieved.

Figures 30B, 30C:
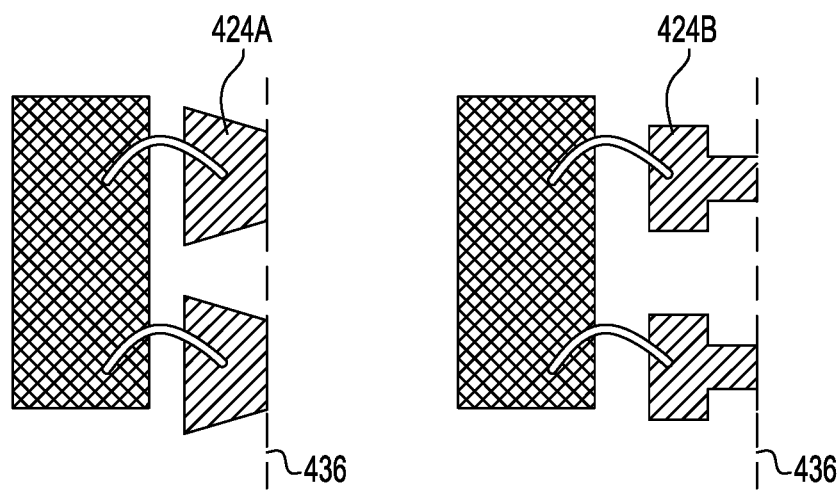
FIGS. 30B and 30C are fragmentary top-down plan views further illustrating a variation of the method illustrated in accordance with FIGS. 21-30.

FIGS. 30B and 30C illustrate a further variation in which leadframe interconnects 424A and 424B, respectively, may include features, e.g., an advantageous geometry, which assist in locking the leadframe interconnects 424A or 424B in place within the dielectric region, e.g., molded dielectric encapsulation of each respective package. With such features, when the cutting instrument severs the leadframe fingers at lines 436 in each example to form the leadframe interconnects 424A or 424B, the features—characterized by a widening of a lateral dimension of the leadframe fingers in a direction away from lines 436—assists in avoiding the leadframe interconnects 424A, 424B from being released from their attachments with the molded dielectric encapsulation after such singulation process.

Figure 31:
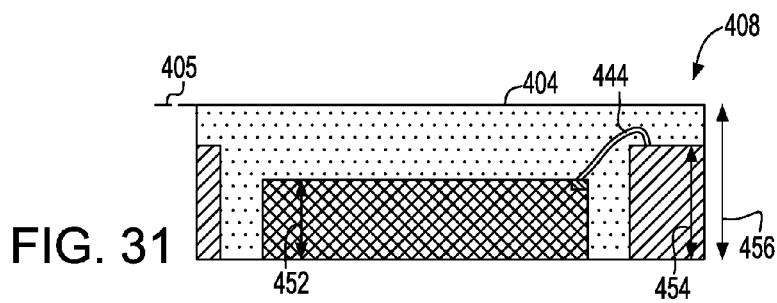
FIG. 31 is a sectional view depicting a microelectronic package according to an embodiment of the invention.

FIG. 31 further depicts the microelectronic package 408 and thicknesses of elements therein in a direction orthogonal to a plane 405 in which a major surface 404 of the package 408 lies. For example, the microelectronic element may have a thickness 452 ranging from 10 to 100 microns. The leadframe interconnect 424 may have a thickness 454 typically of 100 microns when the leadframe interconnect is formed by severing leadframe fingers from a standard leadframe. Although thickness 454 of the leadframe interconnect is shown to be 100 microns, the thickness 454 can be smaller or larger than 100 microns. Given these dimensions and the wire bonds 444 providing the electrical interconnections therein, each microelectronic package 408 may have a thickness 456 of 150-200 microns to account for loop height of the wire bonds 444 extending above top surfaces of the leadframe interconnects.

Figure 32:
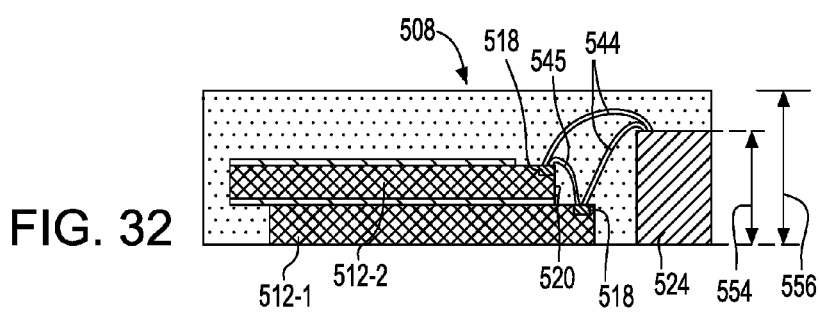
FIG. 32 is a sectional view depicting a microelectronic package according to a variation of the embodiment of the invention depicted in FIG. 31.

Given the above dimensions of a microelectronic package 408 which includes a single microelectronic element, an alternative microelectronic package 508 is illustrated in FIG. 32 which includes first and second microelectronic elements 512-1 and 512-2, each having contacts 518 interconnected via wire bonds 544 with the leadframe interconnects 524. Typically, the microelectronic elements 512-1 and 512-2 are stacked in a staggered manner such that the contacts 518 on the lower positioned microelectronic element 512-1 are disposed beyond an adjacent edge surface 520 of the higher positioned microelectronic element 512-2. In one example, corresponding contacts 518 on each microelectronic element 512-1 and 512-2 can each be wire bonded directly to the same leadframe interconnect 524 via wire bonds 544. In another example, corresponding contacts 518 on the microelectronic element 512-1 and 512-2 can be wire bonded with one another via wire bond 545, and only one of the microelectronic elements 512-1 or 512-2 can be wire bonded directly to the leadframe interconnect 524. It is not necessary, although it is possible, for the contacts 518 of each microelectronic element to be both directly wire bonded to the corresponding leadframe interconnect 524, and to be wire-bonded with one another.

Figure 33:
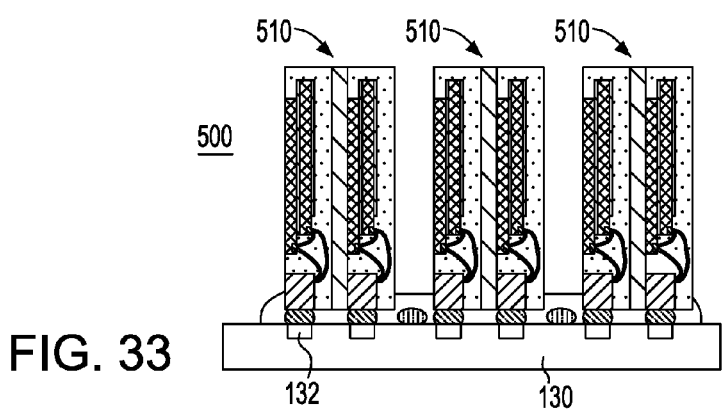
FIG. 33 is a sectional view depicting a microelectronic assembly according to an embodiment of the invention.

FIG. 33 further illustrates a microelectronic assembly 500 which includes one or more "package stacks" 510 each package stack formed by assembling a plurality of multi-chip microelectronic packages 508 each as described relative to FIG. 32. The multi-chip packages in each package stack 510 are electrically interconnected with contacts 132 at a surface of a support element 130 in a manner such as described above relative to FIG. 30.

An advantage of providing more than one microelectronic element electrically coupled with the leadframe interconnects in an individual microelectronic package is a potential to increase a density of interconnection of the microelectronic elements in a microelectronic assembly 500 relative to the contacts 132 of the support element 130. Thus, microelectronic packages 508 incorporating two chips per package are electrically interconnected with the substrate contacts 132 at an effective pitch which is one half the pitch of interconnection between adjacent microelectronic packages 508 in each package stack 510. In one example, a thickness 554 of each leadframe interconnect in a vertical direction of the microelectronic package may be 100 microns for a standard leadframe thickness and a thickness 556 of the microelectronic package can be 200 microns, for example. Thus, when the pitch among substrate contacts 132 is 200 microns, because there are two microelectronic elements in each package which are electrically coupled with the leadframe interconnects of such package, the effective pitch of interconnection among adjacent microelectronic elements in each of the package stacks 510 seen in FIG. 33 can be 100 microns. When the microelectronic elements are microelectronic elements having memory storage arrays therein, corresponding chip contacts on all of the microelectronic elements in the package can be electrically coupled with a single package contact of the package. The same can apply to most or all of the chip contacts of each microelectronic element, except for chip contacts assigned to receive signals routed uniquely to one of the microelectronic elements, such as a chip select input, for example. The same applies to microelectronic elements which provide non-volatile memory storage array function, such non-volatile memory storage array implemented by a greater number of active devices in the microelectronic element than for any other function of the microelectronic element.

The number of microelectronic elements stacked one above the other in each microelectronic package can range from a small number such as one or two to a much larger number, for example, eight, ten or even greater. In one example, four microelectronic elements can be stacked within a single package and are electrically coupled with the package contacts, e.g., leadframe interconnects of such package. In another example, eight microelectronic elements can be stacked within a single package and are electrically coupled with the leadframe interconnects, in a variation of the package as seen in FIG. 32.

Figure 34:
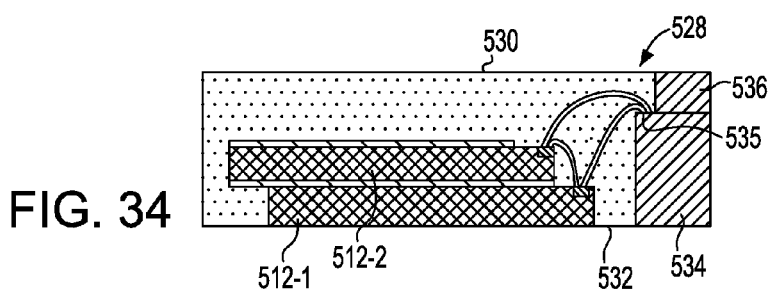
FIG. 34 is a sectional view depicting a microelectronic package according to a variation of the embodiment of the invention depicted in FIG. 32.

Referring to FIG. 34, in a variation of the above-described microelectronic package, a microelectronic package 528 can include leadframe interconnects 534 which are each at a lower surface 532 and at an upper surface 530 of the microelectronic package and, thus, are available for connection with external components at these lower and upper surfaces 532, 530. As shown in FIG. 34, in this variation, each leadframe interconnect may include a ledge 535 to which wire bonds are joined and electrically coupled to the contacts of the microelectronic elements 512-1 and 512-2, and may further include a portion 536 projecting above a height of the ledge 535 and at the upper surface 530 of the microelectronic package.

Referring to FIG. 32 and FIG. 34, in another variation, a greater number of microelectronic elements can be stacked and electrically interconnected to the leadframe interconnects 534 of a given microelectronic package 508 or 528. For example, each microelectronic package may include three, four, or an even greater number of microelectronic elements arranged in an offset stack as seen in FIG. 32 or 34 and electrically interconnected with the leadframe interconnects which are provided in such microelectronic package. Thus, referring to an arrangement of microelectronic elements 512-1 and 512-2 as seen in FIG. 32, a microelectronic package 508 modified in accordance with another arrangement to include four microelectronic elements instead of two would yield an effective pitch of 50 microns for interconnection with each microelectronic element therein.

Figure 35:
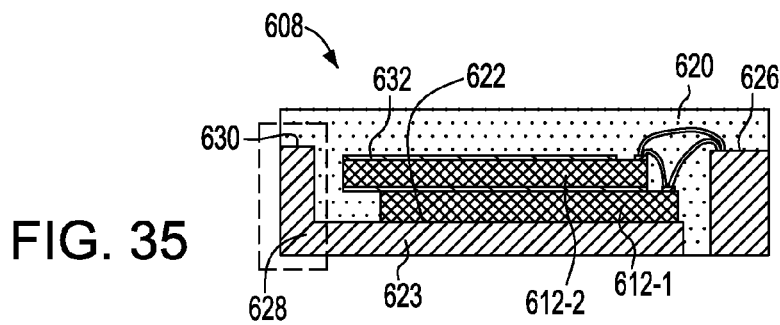
FIG. 35 is a sectional view depicting a microelectronic package according to a variation of the embodiment of the invention depicted in FIG. 32.
Figure 36:
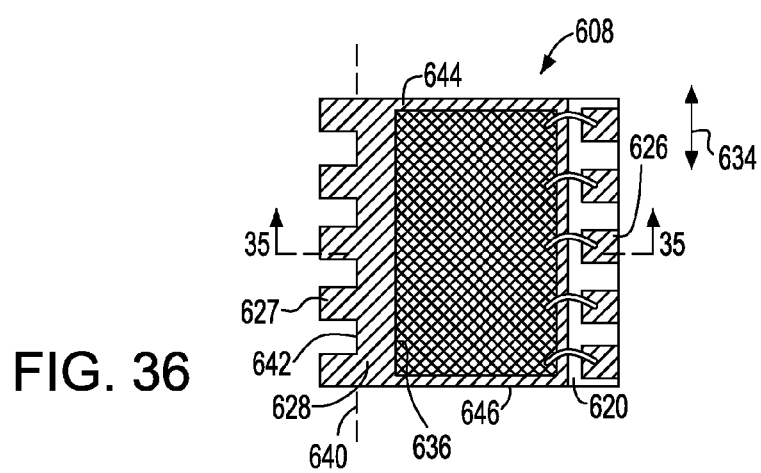
FIG. 36 is a top-down plan view corresponding to FIG. 35.

FIGS. 35 and 36 illustrate a microelectronic package 608 according to a variation of the embodiment described above relative to FIG. 32 in which a chip 612-1 in microelectronic subassembly or package 608 has a major surface 622 bonded to a major surface of a metal die attach pad 623 portion of the leadframe. As further seen in FIGS. 35 and 36, the major surface of the die attach pad can be recessed below a height of the top surfaces 626 of the leadframe interconnects, and thus may accommodate a height of the topmost front surface of one or more microelectronic elements 612-1, 612-2. Thus, the recessed major surface of the die attach pad accommodates a thickness of a first microelectronic element 612-1 which may be bonded directly to the die attach pad 623. When a second microelectronic element 612-2 is present and secured indirectly to the die attach pad 623 through the first microelectronic element 612-1, the recessed major surface of the die attach pad accommodates thicknesses of the first and the second microelectronic elements 612-1 and 612-2. In addition, as further seen in FIGS. 35-36, the leadframe may further include a metal member 628 similar to the metal member 348 described above relative to FIG. 20, but which is mechanically, electrically and thermally connected with the die attach pad 623, e.g., as a portion integral with or alternatively metallurgically joined with the die attach pad. As further seen in FIG. 36, the metal member 628 is elongated in a direction 634 which is parallel to an adjacent edge surface 636 of the at least one microelectronic element 612-1 and 612-2 of the package 608.

After assembly of the microelectronic elements, leadframe, forming electrical interconnections e.g., using wire bonds, a dielectric region 620, and separating the metal member from leadframe fingers 627 adjacent thereto along a plane 640 to form the microelectronic package 608, a surface of the metal member within the plane 640 can define an edge surface of the microelectronic package 608. In addition, the microelectronic package may likewise include additional second and third metal members 644 and 646 which have length elongated in directions parallel to the respective adjacent edges of the microelectronic element. In addition, the metal members 644, 646 may have surfaces which define edge surfaces of the microelectronic package, and, like metal member 628, may extend to a greater height than the die attach pad 623 which accommodates the one or more microelectronic elements 612-1 and 612-2 between the height of an upwardly-facing surface of the die attach pad 623 and the height of a top surface 630 of the metal member. In one example, the metal members 644 and 646 are portions of the die attach pad 623 which extend to opposite edges of the die attach pad 623. In another example, the height of a top surface 630 of the metal member 628, 644 and/or 646 may be higher or lower than the front or active surface 632 of the microelectronic element 612-2.

With such variation, the die attach pad and metal members coupled thereto may provide even greater thermal and electrical conductivity, such as for purposes of transferring heat or providing power or ground connectivity. In addition, a structure which includes the die attach pad and one or more of the above-described metal members 628, 644 and/or 646 may help avoid coupling of unwanted electromagnetic interference between the one or more microelectronic elements 612-1 and 612-2 and the environment external to the metal members.

In addition, the variations described above relative to FIG. 30A, 30B or 30C can be applied to the embodiments described relative to FIGS. 35-36 here.

Figure 37A:
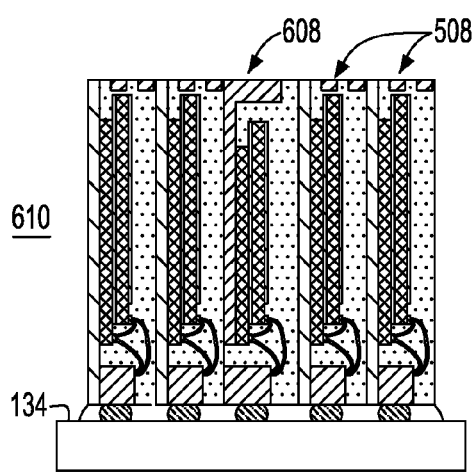
FIG. 37A is a sectional view depicting a microelectronic assembly according to an embodiment of the invention.
Figure 37B:
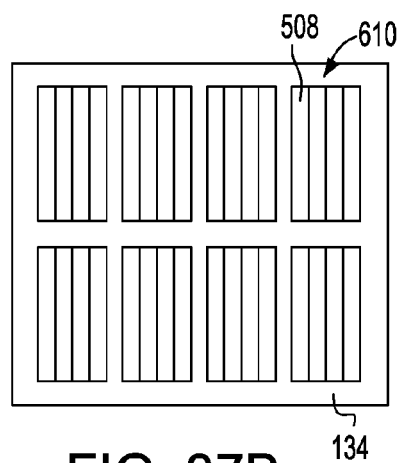
FIG. 37B is a top-down plan view depicting a microelectronic assembly according to an embodiment of the invention.

FIGS. 37A-B illustrate a microelectronic assembly 610 in accordance with a particular example in which a microelectronic package of the type described above relative to FIGS. 35-36 is combined with other microelectronic packages 508 of the type described above relative to FIG. 32. In such assembly, the die attach pad 623 with one or more metal members extending therefrom can function as a heat spreader facilitating conduction of thermal energy away from microelectronic elements therein.

As further seen in the top-down view of FIG. 37B, and in accordance with any of the embodiments herein, a plurality of the microelectronic assemblies, e.g., assembly 610 or 510 (FIG. 33), among others, can be coupled to contacts at a surface 134 of a substrate. In the particular example, eight microelectronic assemblies are shown, each which includes four microelectronic packages such as the package 508 or 608, for example. In one embodiment, each encapsulated microelectronic package of each assembly may include one to eight stacked microelectronic elements. In such case, the assembly of the substrate coupled the plurality of eight microelectronic assemblies shown will include from 32 to 256 microelectronic elements. Referring to FIG. 38, in a microelectronic assembly 710 according to variation of the assembly 610 in FIG. 37A, a plurality of microelectronic packages 609 are arranged together in a stacked configuration, wherein each microelectronic package 609 is the same as a microelectronic package 608 except in this case, each substantially rigid metal member or leadframe element 629 and each leadframe interconnect 625 extends a full thickness of the microelectronic package 609 in a vertical direction of the microelectronic package. In such structure, the metal members 629 of the microelectronic packages are joined together through with a thermally and/or electrically conductive adhesive material 616 bonding the die attach pad 623 of each package to the metal members and a surface of the dielectric region 640 of another microelectronic package immediately adjacent and below the die attach pad of the respective microelectronic package.

Referring to FIGS. 39-40, in a microelectronic package 808 according to a further variation of the single-chip or multiple-chip microelectronic packages described above, the microelectronic element has an edge surface 820 along which contacts 818 of the microelectronic element are disposed, and the leadframe includes a metal member 828 parallel to and elongated in a direction of a length of the interconnect edge surface. As specifically depicted in FIG. 39, the metal member 828 may surround the one or more microelectronic elements 812 within the package and have a ring-like geometry. The metal member may function as an element for electrical connection of the contacts 818 with ground or to other steady voltage such as a reference voltage or a power supply voltage. As further seen in FIG. 39, some contacts 818 may be electrically interconnected directly with the metal member, while others of the contacts are electrically interconnected directly with leadframe interconnects 826 which are disposed beyond the metal member and which may be at a periphery of the microelectronic package 808. Alternatively, some of the leadframe interconnects 826 can be electrically interconnected directly with the metal member 828 and may not have a direct electrical interconnection with a contact 818 of the microelectronic element 812. As depicted in FIGS. 39-40, the electrical interconnections between the contacts, the metal member, and the leadframe interconnects can be through wire bonds. However, other interconnection arrangements are possible, such as further described herein.

Referring to FIG. 41, in a microelectronic package 908 according to a further variation of any of the single-chip or multiple-chip microelectronic packages described above, the contacts 938 of a microelectronic element 912 are electrically interconnected with the leadframe interconnects 926 of the microelectronic package 908 through electrically conductive structure extending above the front surfaces of the microelectronic elements. For example, the electrical interconnections may include vias 938 extending from the contacts and traces 942 extending in a lateral direction relative to the contacts. In other example, the electrical interconnections may include free standing wire bond connections extending from the contacts to the traces 942, similar to that referred to as bond via array ("BVA") technology such as disclosed, for example, in FIG. 7 of commonly owned U.S. application Ser. No. 13/462,158, now U.S. Pat. No. 8,619,659, incorporated by reference herein. In a specific example illustrated in FIG. 41, electrically conductive vias 938 can extend through a dielectric region 940 in a vertical direction above the front surfaces of the microelectronic elements and traces 940 can extend above a surface of the dielectric region 940. In some cases, the traces 942 may contact or be supported on a dielectric layer 946 added above the dielectric region 940, which may be of a different material than the dielectric region 940.

In any of the embodiments described herein, the structures and processing above relating to use of a patterned or unpatterned metal sheet can be utilized instead of a leadframe and references to portions of a leadframe such as leadframe fingers, leadframe interconnects, support members and metal members apply equally to portions of such metal sheet.

Although not specifically shown in the Figures or particularly described in the foregoing, elements in the various Figures and various described embodiments can be combined together in additional variations of the invention.

The invention claimed is:

1. A microelectronic package, comprising:
a microelectronic element having a front surface defining a plane, a rear surface opposite the front surface, and a plurality of edge surfaces between the front and rear surfaces, the microelectronic element having a plurality of chip contacts at the front surface;
a metal die attach pad having an attachment surface underlying and bonded to one of the front or rear surfaces of the microelectronic element;
the package having a plurality of remote surfaces, and an encapsulation region contacting at least one edge surface of the microelectronic element and extending away from the at least one edge surface to a corresponding one of the remote surfaces, the encapsulation region having a major surface substantially parallel to the plane of the microelectronic element; and
a plurality of package contacts at an interconnect surface being a single one of the remote surfaces, the package contacts being electrically coupled with the chip contacts of the microelectronic element, the package contacts defined by leadframe interconnects, the package contacts being configured for electrically connecting the microelectronic package with a corresponding set of substrate contacts at a major surface of a substrate in a state in which the major surface of the substrate is oriented at a substantial angle to the plane of the microelectronic element and is oriented towards the single one of the remote surfaces.

2. The microelectronic package as claimed in claim 1, wherein a portion of the metal die attach pad that is not overlain by the microelectronic element is disposed at a second one of the remote surfaces other than the interconnect surface.

3. The microelectronic package as claimed in claim 2, wherein the portion of the metal die attach pad that is not overlain by the microelectronic element extends above a height of the attachment surface of the metal die attach pad to at least a height of top surfaces of the package contacts.

4. The microelectronic package as claimed in claim 3, wherein the portion of the metal die attach pad that is not overlain by the microelectronic element encloses at least three adjoining edge surfaces of the microelectronic element.

5. The microelectronic package as claimed in claim 4, wherein the portion of the metal die attach pad that is not overlain by the microelectronic element extends above a height of the microelectronic element.

6. The microelectronic package as claimed in claim 3, wherein the portion of the metal die attach pad that is not overlain by the microelectronic element defines a discontinuous metal surface at at least one of the remote surfaces.

7. The microelectronic package as claimed in claim 1, wherein the package contacts comprise features configured to avoid release of the package contacts at the interconnect surface of the encapsulation region.

8. The microelectronic package as claimed in claim 1, further comprising a substantially rigid leadframe element at a second one of the remote surfaces opposite the interconnect surface, the leadframe element having a length dimension parallel to and at least as long as an edge surface of the microelectronic element adjacent the leadframe element, the leadframe element having substantial cross-sectional area transverse to a direction parallel to the length dimension such that the leadframe element functions as a component of a heat spreader thermally coupled to the microelectronic element.

9. The microelectronic package as claimed in claim 1, wherein the package contacts are electrically coupled with the corresponding set of substrate contacts at the major surface of the substrate.

10. The microelectronic package as claimed in claim 1, wherein the microelectronic element is a first microelectronic element, the microelectronic package further comprising a second microelectronic element having front and rear surfaces each defining a plane, edge surfaces between the front and rear surfaces, and chip contacts at the front surface, the second microelectronic element stacked with the first microelectronic element such that the planes of the stacked microelectronic elements are parallel to one another, and wherein the encapsulation region is in contact with the edge surfaces of each of the stacked microelectronic elements, and the chip contacts of each of the stacked microelectronic elements are electrically coupled with the package contacts.

11. A stacked microelectronic assembly, comprising:

a plurality of stacked encapsulated microelectronic packages, each microelectronic package comprising a microelectronic element having a front surface defining a plane and a rear surface opposite the front surface, a metal die attach pad having an attachment surface underlying and bonded to one of the front or rear surfaces of the microelectronic element, an encapsulation region having a major surface substantially parallel to the plane of the microelectronic element and a plurality of remote surfaces extending away from the major surface, a plurality of package contacts at an interconnect surface being a single one of the remote surfaces, the package contacts defined by leadframe interconnects, the microelectronic packages stacked such that the planes of the microelectronic elements are parallel to one another and oriented towards one another, wherein the package contacts are configured for electrically connecting the microelectronic assembly with a corresponding set of substrate contacts at a major surface of a substrate in a state in which the major surface of the substrate is oriented at a substantial angle to the plane of each microelectronic element and is oriented towards each single remote surface of each of the microelectronic packages.

12. The stacked microelectronic assembly as claimed in claim 11, wherein the package contacts of each microelectronic package in the microelectronic assembly are electrically coupled with the corresponding set of substrate contacts at the major surface of the substrate.

13. The microelectronic package as claimed in claim 11, wherein in a package of the stacked microelectronic packages, a portion of the metal die attach pad of such package that is not overlain by the microelectronic element is disposed at a second one of the remote surfaces other than the interconnect surface.

14. The microelectronic package as claimed in claim 13, wherein in the package of the stacked microelectronic packages, the portion of the metal die attach pad of such package that is not overlain by the microelectronic element extends above a height of the attachment surface of the metal die attach pad to at least a height of top surfaces of the package contacts.

15. The microelectronic package as claimed in claim 14, wherein in the package of the stacked microelectronic packages, the portion of the metal die attach pad of such package that is not overlain by the microelectronic element encloses at least three adjoining edge surfaces of the microelectronic element.

16. The stacked microelectronic assembly as claimed in claim 11, wherein a package of the stacked microelectronic packages includes a plurality of the microelectronic elements stacked such that the planes of the stacked microelectronic elements of such package are parallel to one another, and wherein the encapsulation region of the package is in contact with each of the stacked microelectronic elements of the package, and chip contacts of each of the stacked microelectronic elements of the package are electrically coupled with the package contacts of the package.

17. A stacked microelectronic assembly, comprising:

a plurality of stacked encapsulated microelectronic packages, each microelectronic package comprising a microelectronic element having a front surface defining a plane, an encapsulation region having a major surface substantially parallel to the plane of the microelectronic element and a plurality of remote surfaces extending away from the major surface, and a plurality of electrically conductive package contacts at a single one of the remote surfaces, the microelectronic packages stacked such that the planes of the microelectronic elements are parallel to one another and oriented towards one another, wherein the package contacts are configured for electrically connecting the microelectronic assembly with a corresponding set of substrate contacts at a major surface of a substrate in a state in which the major surface of the substrate is oriented at a substantial angle to the plane of each microelectronic element and is oriented towards each single remote surface of each of the microelectronic packages.

18. The stacked microelectronic assembly as claimed in claim 17, wherein the package contacts of each microelectronic package in the microelectronic assembly are electrically coupled with the corresponding set of substrate contacts at the major surface of the substrate.

19. The stacked microelectronic assembly as claimed in claim 17, wherein at least two of the remote surfaces of each microelectronic package are defined by surfaces of the respective encapsulation region that are spaced apart from the respective microelectronic element.

20. The stacked microelectronic assembly as claimed in claim 17, wherein a package of the stacked microelectronic packages includes a plurality of the microelectronic elements stacked such that the planes of the stacked microelectronic elements of such package are parallel to one another, and wherein the encapsulation region of the package is in contact with each of the stacked microelectronic elements of the package, and chip contacts of each of the stacked microelectronic elements of the package are electrically coupled with the package contacts of the package.

* * * * *